US010201826B2

(12) United States Patent
Ichino et al.

(10) Patent No.: US 10,201,826 B2
(45) Date of Patent: Feb. 12, 2019

(54) LIQUID COATING METHOD, LIQUID COATING APPARATUS, AND COMPUTER-READABLE STORAGE MEDIUM

(71) Applicant: Tokyo Electron Limited, Tokyo (JP)

(72) Inventors: Katsunori Ichino, Kumamoto (JP);
Takayuki Ishii, Kumamoto (JP);
Kouzou Kawahara, Kumamoto (JP);
Daisuke Simokawa, Kumamoto (JP);
Kazuyuki Tashiro, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/729,385

(22) Filed: Jun. 3, 2015

(65) Prior Publication Data

US 2015/0352587 A1    Dec. 10, 2015

(30) Foreign Application Priority Data

Jun. 4, 2014   (JP) .................................. 2014-115576
Mar. 3, 2015   (JP) .................................. 2015-041553

(51) Int. Cl.
*B05D 3/12*      (2006.01)
*B05C 5/02*      (2006.01)
(Continued)

(52) U.S. Cl.
CPC .......... *B05C 5/0216* (2013.01); *B05C 5/0225* (2013.01); *B05C 11/1002* (2013.01);
(Continued)

(58) Field of Classification Search
CPC ...... B05D 1/002; B05D 1/005; B05C 5/0216;
B05C 5/0225; B05C 11/1002; H01L 21/6715
(Continued)

(56) References Cited

U.S. PATENT DOCUMENTS

2003/0118741 A1*   6/2003   Gibson ................. B05C 5/0254
                                                                427/8
2004/0261701 A1*   12/2004  Kobayashi ............. G03F 7/162
                                                                118/696

(Continued)

FOREIGN PATENT DOCUMENTS

JP        2001-239199 A      9/2001
JP        2005-251864 A      9/2005

*Primary Examiner* — Kristen Jolley
(74) *Attorney, Agent, or Firm* — Abelman, Frayne & Schwab

(57) ABSTRACT

Disclosed is a liquid coating method. The method executes processes of: coating a coating liquid in a spiral form on a surface of a substrate by ejecting the coating liquid from the ejection nozzle while moving the ejection nozzle in a predetermined direction between the rotary axis and a peripheral edge of the substrate during rotation of the substrate; making a linear velocity at an ejection position of the coating liquid from the ejection nozzle substantially constant by reducing a number of rotations of the substrate as the ejection position is positioned closer to the peripheral edge of the substrate; and making an ejection flow rate of the coating liquid ejected from the ejection nozzle substantially constant by changing a gap between the ejection port of the ejection nozzle and the surface of the substrate based on a flow rate of the coating liquid before ejection from the ejection nozzle.

4 Claims, 19 Drawing Sheets

(51) Int. Cl.
   *B05C 11/10* (2006.01)
   *B05D 1/00* (2006.01)
   *G03F 7/16* (2006.01)
   *H01L 21/67* (2006.01)
(52) U.S. Cl.
   CPC ............ *B05D 1/002* (2013.01); *B05D 1/005* (2013.01); *G03F 7/162* (2013.01); *H01L 21/6715* (2013.01)
(58) Field of Classification Search
   USPC ........................................................ 427/240
   See application file for complete search history.

(56) References Cited

U.S. PATENT DOCUMENTS

2005/0058775 A1\* 3/2005 Oku ...................... B05D 1/005
   427/240
2015/0211836 A1\* 7/2015 deVilliers ......... H01L 21/67288
   702/36

\* cited by examiner

LIQUID COATING METHOD, LIQUID COATING APPARATUS, AND COMPUTER-READABLE STORAGE MEDIUM

CROSS-REFERENCE TO RELATED APPLICATIONS

This application is based on and claims priority from Japanese Patent Application Nos. 2014-115576 and 2015-041553, filed on Jun. 4, 2014 and Mar. 3, 2015, respectively, with the Japan Patent Office, the disclosures of which are incorporated herein in their entirety by reference.

TECHNICAL FIELD

The present disclosure is related to a liquid coating method, a liquid coating apparatus, and a computer-readable storage medium.

BACKGROUND

At present, in micromachining a substrate, forming an unevenness pattern (e.g., a resist pattern) on a substrate (e.g., a semiconductor wafer) using a photolithography technology is widely and generally performed. In order to finely process the substrate, various coating liquids are ejected toward a surface of the substrate from an ejection port of a nozzle Japanese Patent Laid-Open Publication No. 2001-239199 discloses a coating liquid coating method, in which ejecting a coating liquid from an ejection port of a nozzle to a surface of a substrate in rotation while moving the nozzle along the surface of the substrate is disclosed as one exemplary embodiment for forming a coating film on a surface of a substrate. Thus, the coating liquid is coated on the surface of the substrate in a spiral shape. In this case, as compared with a so-called spin coat method that coats a coating liquid on the entire surface of a substrate using a centrifugal force by rotating the substrate after ejecting the coating liquid to the central portion of the substrate, the coating liquid can be saved, and the film thickness of the coating film can be controlled in a direction from the rotational center of the substrate to the peripheral edge of the substrate. However, since the surface of the substrate is not completely flat, the film thickness of the coating film may vary according to the height of the surface of the substrate even with the method disclosed in Japanese Patent Laid-Open Publication No. 2001-239199.

The coating liquid coating method disclosed in Japanese Patent Laid-Open Publication No. 2005-251864 includes: a plate thickness measurement process of measuring the plate thickness of the substrate in advance, an adjustment process of adjusting a separation distance (gap) between the ejection port of the nozzle and a stage on which the substrate is placed, based on the measured plate thickness of the substrate, and an ejection process of ejecting the coating liquid to the surface of the substrate from the ejection port of the ejection nozzle. With this method, since the gap between the surface of the substrate and the ejection port of the nozzle is maintained constantly, a coating film having a substantially uniform film thickness is formed on the surface of the substrate.

Japanese Patent Laid-Open Publication No. 2005-251864 discloses, as a plate thickness measurement method for measuring a plate thickness of a substrate in advance, (1) calculating the plate thickness of the substrate based on a region shielded by the plate thickness of the substrate, using a one-dimensional semiconductor laser array that projects parallel rays distributed in a vertical direction (in the thickness direction of the substrate, and (2) emitting light beams obliquely with respect to a predetermined location of the substrate from the rear side of the substrate and calculating the plate thickness of the substrate based on a light reception position of the reflected light thereof. Thus, in the adjustment process, the gap adjustment is performed by assuming that the plate thickness of the substrate is substantially constant within the substrate plane.

SUMMARY

A liquid coating method related to one aspect of the present disclosure includes performing a coating processing of coating a coating liquid on a surface of a substrate by ejecting the coating liquid to the surface of the substrate from an ejection nozzle positioned above the substrate while rotating the substrate around a rotary axis extending along a direction orthogonal to the surface of the substrate. The coating processing includes: a process of coating the coating liquid in a spiral form on the surface of the substrate by ejecting the coating liquid from the ejection nozzle while moving the ejection nozzle in a predetermined direction along the surface of the substrate between the rotary axis and a peripheral edge of the substrate during the rotation of the substrate; a process of making a linear velocity at an ejection position of the coating liquid from the ejection nozzle substantially constant by reducing a number of rotations of the substrate as the ejection position is positioned closer to the peripheral edge of the substrate within the surface of the substrate; and a process of making an ejection flow rate of the coating liquid ejected from the ejection nozzle substantially constant by changing a height position of an ejection port of the ejection nozzle with respect to the surface of the substrate based on a change of a physical quantity at the ejection nozzle that is ejecting the coating liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
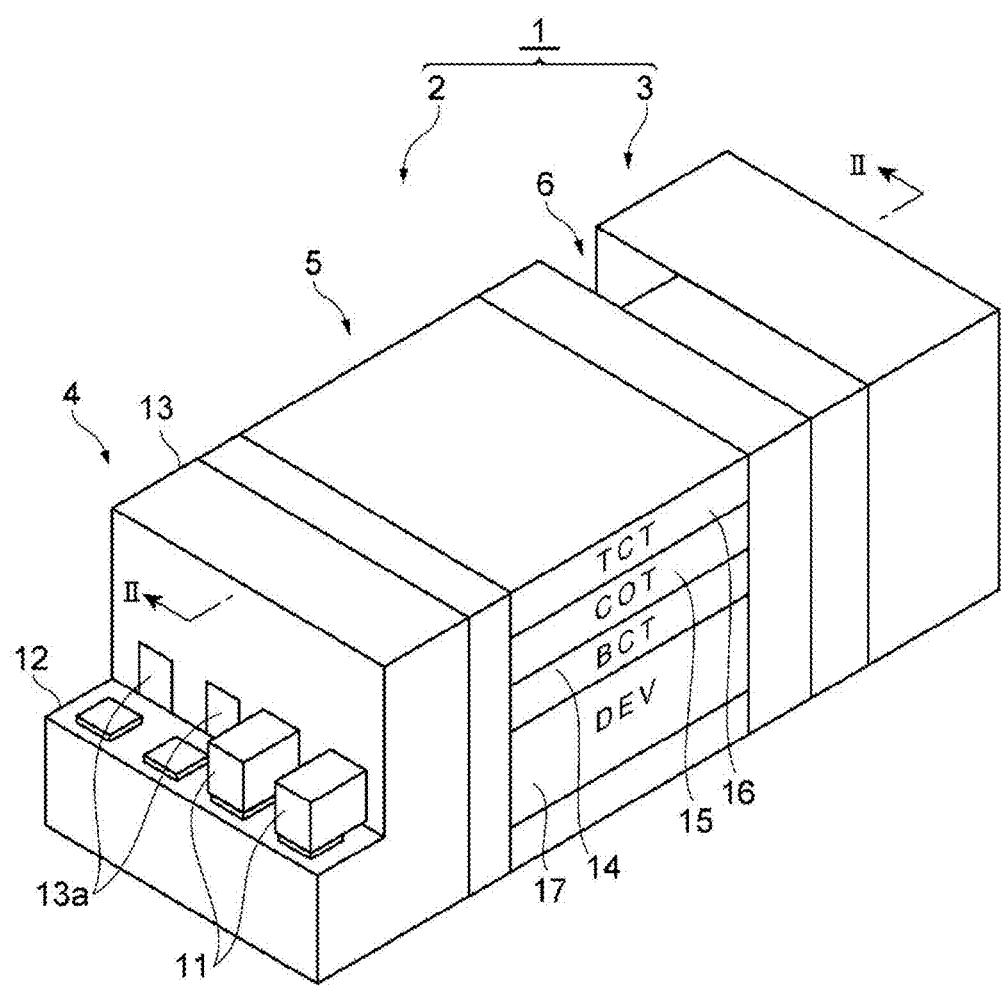
FIG. 1 is a perspective view illustrating a substrate processing system related to a first exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the above-described measurement methods (1) and (2), the entire in-plane plate thickness of the substrate is not acquired. Thus, when a variation exists in the in-plane plate thickness, it is difficult to form a coating film having a substantially uniform film thickness on the substrate. In addition, even if the in-plane plate thickness of the substrate is substantially uniform, the gap varies in the substrate plane in a case where, for example, the substrate is warped and thus the substrate is not flat. Thus, it is difficult to form a coating film having a substantially uniform film thickness on the substrate merely by measuring the plate thickness.

Thus, the present disclosure discloses a liquid coating method, a liquid coating apparatus, and a computer-readable storage medium which are capable of achieving better uniformness in the film thickness of a coating film formed on a surface of a substrate.

A liquid coating method related to one aspect of the present disclosure includes performing a coating processing of coating a coating liquid on a surface of a substrate by ejecting the coating liquid to the surface of the substrate from an ejection nozzle positioned above the substrate while rotating the substrate around a rotary axis extending along a direction orthogonal to the surface of the substrate. The coating processing includes: a process of coating the coating liquid in a spiral form on the surface of the substrate by ejecting the coating liquid from the ejection nozzle while moving the ejection nozzle in a predetermined direction along the surface of the substrate between the rotary axis and a peripheral edge of the substrate during the rotation of the substrate; a process of making a linear velocity at an ejection position of the coating liquid from the ejection nozzle substantially constant by reducing a number of rotations of the substrate as the ejection position is positioned closer to the peripheral edge of the substrate within the surface of the substrate; and a process of making an ejection flow rate of the coating liquid ejected from the ejection nozzle substantially constant by changing a height position of an ejection port of the ejection nozzle with respect to the surface of the substrate based on a change of a physical quantity at the ejection nozzle that is ejecting the coating liquid.

In the liquid coating method related to one aspect of the present disclosure described above, the ejection flow rate of the coating liquid is made to be substantially constant by changing the height position of the ejection port of the ejection nozzle with respect to the surface of the substrate while making a linear velocity at the ejection position substantially constant. Thus, the amount of the ejected coating liquid becomes substantially equal at any ejection position. In addition, in the liquid coating method related to one aspect of the present disclosure described above, the coating liquid is coated on the surface of the substrate in the spiral form. Thus, the coating liquid ejected from the ejection nozzle hardly overlaps on the surface of the substrate. From the foregoing, the film thickness of the coating film formed by coating the coating liquid on the surface of the substrate becomes substantially uniform over the entire surface of the substrate.

In the process of making the ejection flow rate of the coating liquid ejected from the ejection nozzle substantially constant, the height position may be changed based on the flow rate of the coating liquid before the coating liquid is ejected from the ejection nozzle. In this case, when a feedback control is performed so as to make the flow rate of the coating liquid before being ejected from the ejection nozzle to approach a substantially constant value, the height position may be reliably changed in a short time.

In the process of making the ejection flow rate of the coating liquid ejected from the ejection nozzle substantially constant, the height position may be changed based on a magnitude of a reaction force received by the ejection nozzle from the surface of the substrate through the coating liquid when the ejection nozzle ejects the coating liquid to the surface of the substrate. In this case, when a feedback control is performed so as to make the magnitude of the reaction force received by the ejection nozzle approach a substantially constant value, the height position may be reliably changed in a short time.

A liquid coating method related to another aspect of the present disclosure includes performing a coating processing of coating a coating liquid on a surface of a substrate by ejecting the coating liquid to the surface of the substrate from an ejection nozzle positioned above the substrate while rotating the substrate around a rotary axis extending along a direction orthogonal to the surface of the substrate. The coating processing includes: a process of coating the coating liquid in a spiral form on the surface of the substrate by ejecting the coating liquid from the ejection nozzle while moving the ejection nozzle in a predetermined direction along the surface of the substrate between the rotary axis and a peripheral edge of the substrate during the rotation of the substrate; a process of making a linear velocity at an ejection position of the coating liquid from the ejection nozzle substantially constant by reducing a number of rotations of the substrate as the ejection position is positioned closer to the peripheral edge of the substrate within the surface of the substrate; and a process of making an ejection flow rate of the coating liquid ejected from the ejection nozzle substantially constant by changing a height position of an ejection port of the ejection nozzle with respect to the surface of the substrate based on a previously acquired in-plane shape of the surface of the substrate.

In the liquid coating method related to another aspect of the present disclosure, the spaced distance (gap) between the surface of the substrate and the ejection port of the ejection nozzle is made to be substantially constant by changing the height position of the ejection port of the ejection nozzle with respect to the surface of the substrate based on the previously acquired in-plane shape of the surface of the substrate while making the linear velocity at the ejection position substantially constant. Thus, the amount of the ejected coating liquid becomes substantially equal at any ejection position. In addition, in the liquid coating method related to another aspect of the present disclosure described above, the coating liquid is coated on the surface of the substrate in the spiral form. Thus, the coating liquid ejected from the ejection nozzle hardly overlaps on the surface of the substrate. From the foregoing, the film thickness of the coating film formed by coating the coating liquid on the surface of the substrate becomes substantially uniform over the entire surface of the substrate.

The in-plane shape may be measured in a processing chamber that is different from a processing chamber in which the coating processing is performed, prior to the coating processing. In this case, the coating processing and the processing of measuring the in-plane shape may be simultaneously performed in different processing chambers. Thus, the entire processing time may be shortened.

The in-plane shape may be measured in a processing chamber in which the coating processing is performed, prior to the coating processing. In this case, the coating processing and the processing of measuring the in-plane shape are performed in the same processing chamber. Thus, since it is not necessary to provide processing chambers according to respective processings, the apparatus may be miniaturized.

A moving speed of a sensor that measures the in-plane shape and a rotating speed of the substrate at the time of measuring the in-plane shape may be set to be substantially equal to a moving speed of the ejection nozzle and a rotating speed of the substrate at the time of performing the coating processing, respectively. In this case, since it is not necessary to correct data in consideration of variations the moving speed of the sensor, the moving speed of the ejection nozzle, and the rotating speed of the substrate, the calculation (data processing) at the time of controlling the height position of the ejection nozzle may be simplified.

The coating processing may be performed along with the processing of measuring the in-plane shape. In this case, a feed forward control is performed before the gap is changed due to the change of the in-plane shape of the substrate. Thus, the gap may be maintained at a substantially uniform size. Thus, since it is not necessary to measure the entire in-plane shape of the substrate prior to performing the coating processing, the entire processing time may be shortened.

In the coating processing, a sensor configured to measure the in-plane shape and the ejection nozzle may be moved so that the ejection nozzle passes on a scanning track, which is a track on the surface of the substrate when the sensor is moved above the surface of the substrate, while maintaining a constant spaced distance between the sensor and the ejection nozzle. In this case, when the ejection nozzle passes through a point where the sensor has passed on the surface of the substrate, the linear velocities of the ejection nozzle and the sensor at the passing point become substantially equal to each other. Thus, since the data obtained by measuring the in-plane shape using the sensor may be used as it is without performing, for example, correction, the calculation (data processing) at the time of controlling the height position of the ejection nozzle may be simplified and the gap may be adjusted with a better precision.

A liquid coating apparatus related to still another aspect of the present disclosure includes: a rotary holding unit configured to hold a substrate, and rotate the substrate around a rotary axis extending in a direction orthogonal to a surface of the substrate; a supply unit configured to supply a coating liquid to an ejection nozzle so as to eject the coating liquid from an ejection nozzle positioned above the substrate to the surface of the substrate; a driving unit configured to move the ejection nozzle; and a control unit. The control unit controls the rotary holding unit, the supply unit, and the driving unit so as to execute: a processing of coating the coating liquid on the surface of the substrate in a spiral form by causing the supply unit to eject the coating liquid from the ejection nozzle while causing the driving unit to move the ejection nozzle in a predetermined direction along the surface of the substrate between the rotary axis and a peripheral edge of the substrate when the rotary holding unit is rotating the substrate; a processing of making an linear velocity at an ejection position of the coating liquid from the ejection nozzle substantially constant by causing the rotary holding unit to rotate the substrate in such a manner that, as the ejection position is positioned closer to the peripheral edge of the substrate within the surface of the substrate, a number of rotations of the substrate is reduced; and a processing of making an ejection flow rate of the coating liquid ejected from the ejection nozzle substantially constant by causing the driving unit to raise or lower the ejection nozzle so as to change a height position of the ejection port of the ejection nozzle with respect to the surface of the substrate based on a change of a physical quantity at the ejection nozzle that is ejecting the coating nozzle.

In the liquid coating apparatus related to still another aspect of the present disclosure described above, the ejection flow rate of the coating liquid ejected from the ejection nozzle is made to be substantially constant by causing the driving unit to raise or lower the ejection nozzle to change the height position of the ejection port of the ejection nozzle with respect to the surface of the substrate while making a linear velocity at the ejection position substantially constant. Thus, the amount of the ejected coating liquid becomes substantially equal at any ejection position. In addition, in the liquid coating apparatus related to still another aspect of the present disclosure described above, the coating liquid is coated on the surface of the substrate in the spiral form. Thus, the coating liquid ejected from the ejection nozzle hardly overlaps on the surface of the substrate. From the foregoing, the film thickness of the coating film formed by coating the coating liquid on the surface of the substrate becomes substantially uniform over the entire surface of the substrate.

The liquid coating apparatus may further include a flow rate measuring unit configured to measure a flow rate of the coating liquid before the coating liquid is ejected from the ejection nozzle. When the control unit executes the processing of making the ejection flow rate of the coating liquid ejected from the ejection nozzle substantially constant, the driving unit may raise or lower the ejection nozzle to change the height position based on the flow rate measured by the flow rate measuring unit. In this case, when a feedback control is performed by the flow rate measuring unit so as to make the flow rate of the coating liquid before being ejected from the ejection nozzle approach a substantially constant value, the height position may be reliably changed in a short time.

The liquid coating apparatus may further include a reaction force measuring unit configured to measure a magnitude of a reaction force received by the ejection nozzle from the surface of the substrate through the coating liquid when the ejection nozzle ejects the coating liquid to the surface of the substrate. When the control unit executes the processing of making the ejection flow rate of the coating liquid ejected from the ejection nozzle substantially constant, the driving unit may raise or lower the ejection nozzle to change the height position based on the magnitude of the reaction force measured by the reaction force measuring unit. In this case, when a feedback control is performed by the reaction force measuring unit so as to make the magnitude of the reaction force received by the ejection nozzle approach a substantially constant value, the height position may be reliably changed in a short time.

A liquid coating apparatus related to still another aspect of the present disclosure includes: a rotary holding unit configured to hold a substrate, and rotate the substrate around a rotary axis extending in a direction orthogonal to a surface of the substrate; a supply unit configured to supply a coating liquid to an ejection nozzle so as to eject the coating liquid from an ejection nozzle positioned above the substrate to the surface of the substrate; a driving unit configured to move the ejection nozzle; and a control unit. The control unit controls the rotary holding unit, the supply unit, and the driving unit so as to execute: a processing of coating the coating liquid on the surface of the substrate in a spiral form by causing the supply unit to eject the coating liquid from the ejection nozzle while causing the driving unit to move the ejection nozzle in a predetermined direction along the surface of the substrate between the rotary axis and a peripheral edge of the substrate when the rotary holding unit is rotating the substrate; a processing of making an linear velocity at an ejection position of the coating liquid from the ejection nozzle substantially constant by causing the rotary holding unit to rotate the substrate in such a manner that, as the ejection position is positioned closer to the peripheral edge of the substrate within the surface of the substrate, a number of rotations of the substrate is reduced; and a processing of making an ejection flow rate of the coating liquid ejected from the ejection nozzle substantially constant by causing the driving unit to raise or lower the ejection nozzle so as to change a height position of the ejection port of the ejection nozzle with respect to the surface of the substrate based on a previously acquired in-plane shape of the surface of the substrate.

In the liquid coating apparatus related to still another aspect of the present disclosure described above, the spaced distance (gap) between the surface of the substrate and the ejection port of the ejection nozzle is made to be substantially constant by changing the height position of the ejection port of the ejection nozzle with respect to the surface of the substrate based on the previously acquired in-plane shape of the surface of the substrate while making the linear velocity at the ejection position substantially constant. Thus, the amount of the ejected coating liquid becomes substantially equal at any ejection position. In addition, in the liquid coating apparatus related to still another aspect of the present disclosure described above, the coating liquid is coated on the surface of the substrate in the spiral form. Thus, the coating liquid ejected from the ejection nozzle hardly overlaps on the surface of the substrate. From the foregoing, the film thickness of the coating film formed by coating the coating liquid on the surface of the substrate becomes substantially uniform over the entire surface of the substrate.

The liquid coating apparatus related to still another aspect of the present disclosure described above may further include a sensor configured to measure the in-plane shape. The control unit may cause the sensor to measure the in-plane shape within a processing chamber that is different from a chamber where the processing of coating the coating liquid on the surface of the substrate in the spiral form is performed, prior to the processing. In this case, the coating processing and the processing of measuring the in-plane shape may be simultaneously performed in different processing chambers. Thus, the entire processing time may be shortened.

The liquid coating apparatus related to still another aspect of the present disclosure described above may further include a sensor configured to measure the in-plane shape. The control unit causes the sensor to measure the in-plane shape within a processing chamber where the processing of coating the coating liquid on the surface of the substrate in the spiral form is performed, prior to the processing of coating the coating liquid. In this case, the coating processing and the processing of measuring the in-plane shape are performed in the same processing chamber. Thus, since it is not necessary to provide processing chambers according to respective processings, the apparatus may be miniaturized.

The control unit may set the moving speed of the sensor configured to measure the in-plane shape and the rotating speed of the substrate at the time of measuring the in-plane shape to be substantially equal to the moving speed of the ejection nozzle and the rotating speed of the substrate at the time of performing the coating processing, respectively. In this case, since it is not necessary to correct data in consideration of variations the moving speed of the sensor, the moving speed of the ejection nozzle, and the rotating speed of the substrate, the calculation (data processing) at the time of controlling the height position of the ejection nozzle may be simplified.

The liquid coating apparatus related to still another aspect of the present disclosure may further include a sensor configured to measure the in-plane shape. The control unit may cause the sensor to measure the in-plane shape together with the processing of coating the coating liquid on the surface of the substrate in the spiral form. In this case, a feed forward control is performed before the gap is changed due to the change of the in-plane shape of the substrate. Thus, the gap may be maintained at a substantially uniform size. Thus, since it is not necessary to measure the entire in-plane shape of the substrate prior to performing the coating processing, the entire processing time may be shortened.

In the processing of coating the coating liquid on the surface of the substrate in the spiral form, the control unit may move the sensor configured to measure the in-plane shape and the ejection nozzle so that the ejection nozzle passes on a scanning track, which is a track on the surface of the substrate when the sensor is moved above the surface of the substrate, while maintaining a constant spaced distance between the sensor and the ejection nozzle. In this case, when the ejection nozzle passes through a point where the sensor has passed on the surface of the substrate, the linear velocities of the ejection nozzle and the sensor at the passing point become substantially equal to each other. Thus, since the data obtained by measuring the in-plane shape using the sensor may be used as it is without performing, for example, correction, the calculation (data processing) at the time of controlling the height position of the ejection nozzle may be simplified and the gap may be adjusted with a better precision.

A liquid coating apparatus related to yet another aspect of the present disclosure includes: a rotary holding unit configured to hold a substrate, and rotate the substrate around a rotary axis extending in a direction orthogonal to a surface of the substrate; a supply unit configured to supply a coating liquid to an ejection nozzle so as to eject the coating liquid from an ejection nozzle positioned above the substrate to the surface of the substrate; a driving unit configured to move the ejection nozzle; an elastic body configured to apply an elastic force on the ejection nozzle; and a control unit. The control unit controls the rotary holding unit, the supply unit, and the driving unit so as to execute: a processing of coating the coating liquid within the surface of the substrate in a spiral form by causing the supply unit to eject the coating liquid from the ejection nozzle while causing the driving unit to move the ejection nozzle in a predetermined direction along the surface of the substrate between the rotary axis and a peripheral edge of the substrate when the rotary holding unit is rotating the substrate; and a processing of making an linear velocity at an ejection position of the coating liquid from the ejection nozzle substantially constant by causing the rotary holding unit to rotate the substrate in such a manner that, as the ejection position is positioned closer to the peripheral edge of the substrate on the surface of the substrate, a number of rotations of the substrate is reduced, and wherein an elastic force, which is generated in the elastic body according to a reaction force received by the ejection nozzle from the surface of the substrate through the coating liquid when the ejection nozzle ejects the coating liquid to the surface of the substrate, acts on the ejection nozzle so that a height position of an ejection port of the ejection nozzle with respect to the surface of the substrate is changed by the elastic body to make an ejection flow rate of the coating liquid ejected from the ejection nozzle substantially constant.

In the liquid coating apparatus related to yet another aspect of the present disclosure, the ejection flow rate of the coating liquid ejected from the ejection nozzle is made to be substantially constant by causing the driving unit to raise or lower the ejection nozzle to change the height position of the ejection port of the ejection nozzle with respect to the surface of the substrate while making a linear velocity at the ejection position substantially constant. Thus, the amount of the ejected coating liquid becomes substantially equal at any ejection position. In addition, in the liquid coating apparatus related to still another aspect of the present disclosure described above, the coating liquid is coated on the surface of the substrate in the spiral form. Thus, the coating liquid ejected from the ejection nozzle hardly overlaps on the surface of the substrate. From the foregoing, the film thickness of the coating film formed by coating the coating liquid on the surface of the substrate becomes substantially uniform over the entire surface of the substrate. Furthermore, since the restoring force according to the reaction force received by the ejection nozzle is generated in the elastic body, the restoring force acts on the ejection nozzle so that the spaced distance between the ejection port of the ejection nozzle and the surface of the substrate may be reliably changed within a short time.

A computer-readable storage medium according to yet another aspect of the present disclosure stores a program to execute any of above-described methods in a liquid coating apparatus. The computer-readable storage medium related to yet another aspect of the present disclosure enables a coating film to be more uniformly formed on a surface of a substrate as in the methods as described above. Herein, the computer-readable storage medium includes, for example, a non-transitory computer recording medium) (e.g., various main memories or auxiliary memories), or a transitory computer recording medium (e.g., a data signal capable of being provided through a network).

According to a liquid coating method, a liquid coating apparatus, and a computer-readable storage medium related to the present disclosure, better uniformness in a film thickness of a coating film formed on a surface of a surface may be achieved.

First Exemplary Embodiment

[Configuration of Substrate Processing System]

A substrate processing system 1 includes a coating/developing apparatus 2 and an exposure apparatus 3. The exposure apparatus 3 performs an exposure processing of a resist film. Specifically, an energy ray is irradiated to an exposure target portion of the resist film (a photosensitive film) through a method such as, for example, liquid immersion exposure. As the energy ray, an ArF excimer laser, a KrF excimer laser, a g-ray, an I-ray, or extreme ultraviolet (EUV) may be exemplified.

The coating/developing apparatus (substrate processing apparatus) 2 performs a processing of forming a resist film on a surface of a wafer W (substrate) before the exposure processing by the exposure apparatus 3, and performs a developing processing of the resist film after the exposure processing. In the first exemplary embodiment, the wafer W has a disc shape. However, a wafer having a circular shape, a portion of which is cut out, or a wafer having a shape other than the circular shape such as, for example, a polygonal shape, may be used. The wafer W may be, for example, a semiconductor substrate, a glass substrate, a mask substrate, a flat panel display (FPD), and the other various substrates.

Figure 2:
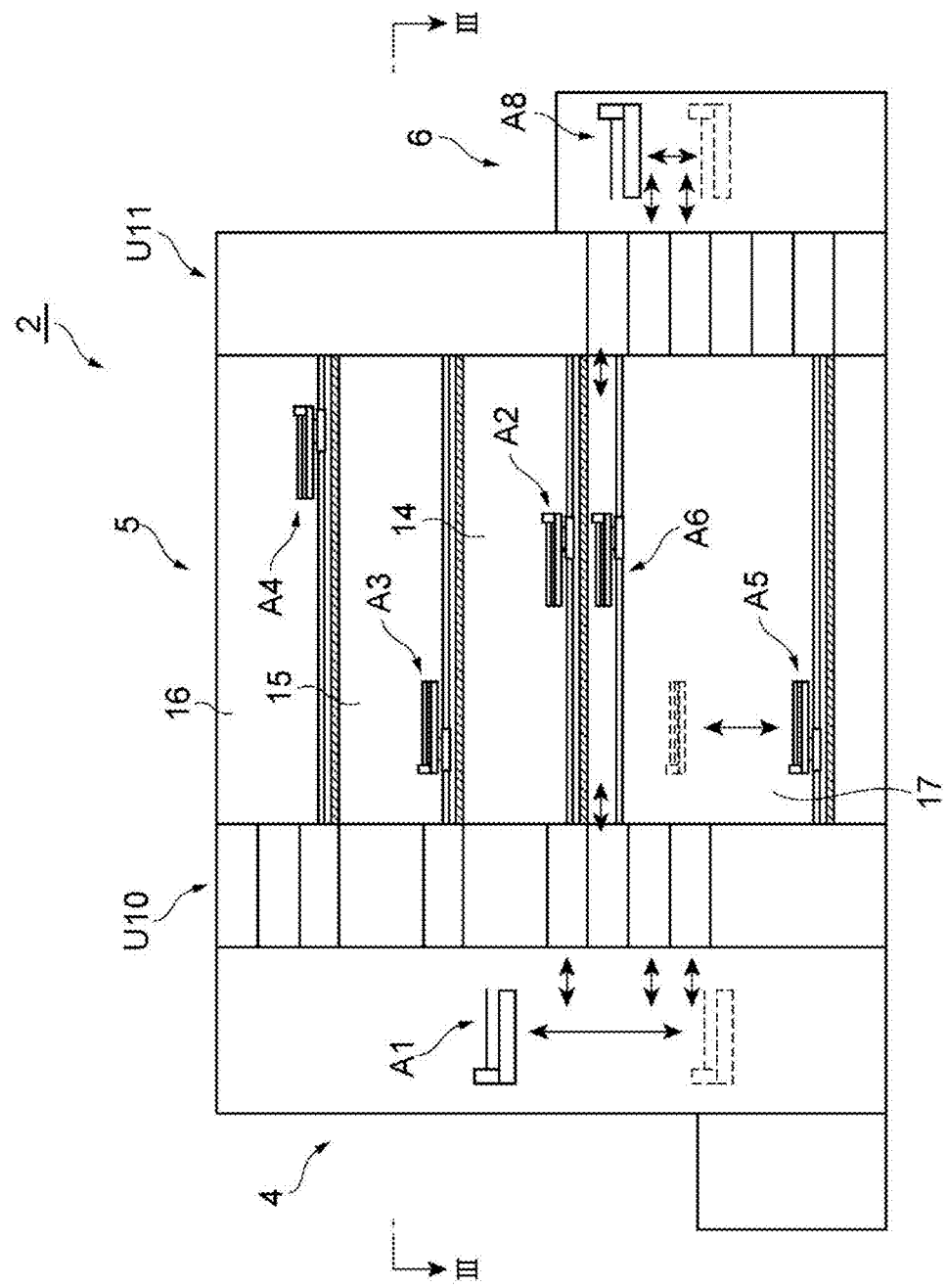
FIG. 2 is a cross-sectional view taken along line II-II in FIG. 1.
Figure 3:
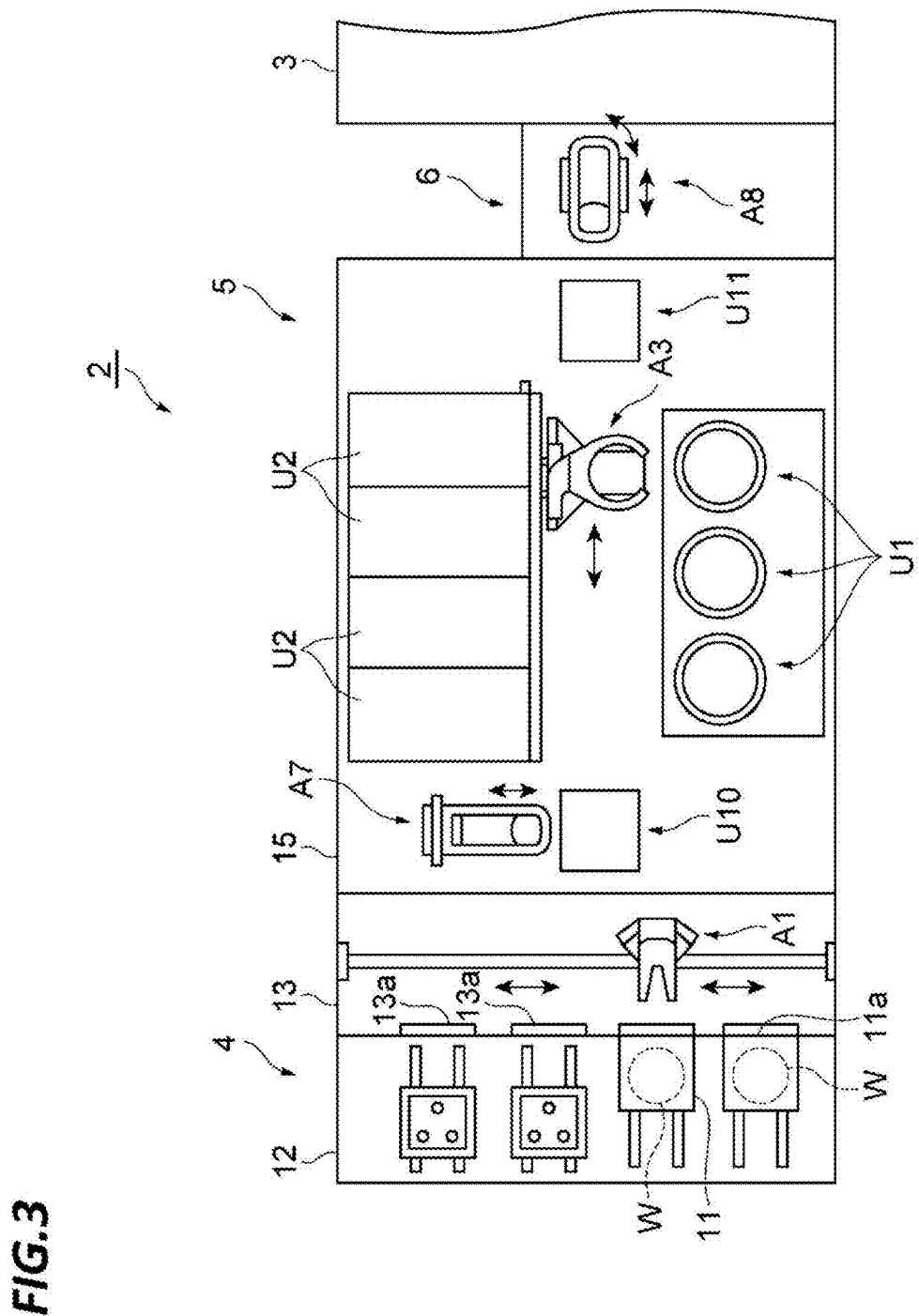
FIG. 3 is a cross-sectional view taken along line III-III in FIG. 2.

As illustrated in FIGS. 1 to 3, the coating/developing apparatus 2 includes a carrier block 4, a processing block 5, and an interface block 6. The carrier block 4, the processing block 5, and the interface block 6 are arranged in a horizontal direction.

The carrier block 4 includes a carrier station 12 and a carry-in/out unit 13. The carry-in/out unit 13 is interposed between the carrier station 12 and the processing block 5. The carrier station 12 supports a plurality of carriers 11. Each carrier 11 accommodates, for example, a plurality of circular wafers W in a sealed state and includes an opening/closing door (not illustrated) for inputting/outputting the wafers W on a side surface 11a (see, e.g., FIG. 3). The carrier 11 is detachably mounted on the carrier station 12 such that the side surface 11a faces the carry-in/out unit 13 side. The carry-in/out unit 13 includes a plurality of opening/closing doors 13a which correspond to the plurality of carriers 11 on the carrier station 12, respectively. When the opening/closing door of the side surface 11a and the corresponding opening/closing doors 13a are simultaneously opened, the interior of the carrier 11 and the interior the carry-in/out unit 13 are communicated with each other. The carry-in/out unit 13 incorporates an exchange arm A1. The exchange arm A1 takes out a wafer W from the carrier 11 so as to deliver the wafer W to the processing block 5, and receives a wafer W from the processing block 5 so as to return the wafer W to the interior of the carrier 11.

The processing block 5 includes a BCT module (under-layer film forming module) 14, a COT module (resist film forming module) 15, a TCT module (upper-layer film forming module) 16, and a DEV module (developing processing module) 17. The modules are arranged in the order of the DEV module 17, the BCT module 14, the COT module 15, and the TCT module 16 from the floor side.

The BCT module 14 is configured to form an underlayer film on a surface of a wafer W. The BCT module 14 incorporates a plurality of coating units (not illustrated), a plurality of thermal processing units (not illustrated), and a conveyance arm A2 configured to convey the wafer W to these units. The coating unit is configured to coat a coating liquid for formation of the underlayer film on the surface of the wafer W. The thermal processing unit is configured to perform a thermal processing by heating the wafer W by, for example, a hot plate, and cooling the heated wafer W by, for example, a cooling plate. As a specific example of the thermal processing performed in the BCT module 14, a heating processing for curing the coating liquid may be exemplified.

The COT module 15 is configured to form a thermosetting and photosensitive resist film on the underlayer film. The COT module 15 incorporates a plurality of coating units U1, a plurality of thermal processing units U2, and a conveyance arm A3 configured to convey the wafer W to these units (see, e.g., FIGS. 2 and 3). The coating unit (film forming apparatus) (U1) is configured to coat a coating liquid for formation of the resist film (resist composition) on the underlayer film. The thermal processing unit U2 is configured to perform a thermal processing by heating the wafer W by, for example, a hot plate, and cooling the heated wafer W by, for example, a cooling plate. As a specific example of the thermal processing performed in the COT module 15, a heating processing (pre-applied bake (PAB)) for curing the coating liquid may be exemplified.

The TCT module 16 is configured to form an upper-layer film on a resist film. The TCT module 16 incorporates a plurality of coating units (not illustrated), a plurality of thermal processing units (not illustrated), and a conveyance arm A4 configured to convey the wafer W to these units. The coating unit is configured to coat a coating liquid for formation of the upper-layer film on the surface of a wafer W. The thermal processing unit is configured to perform a thermal processing by heating the wafer W by, for example, a hot plate, and cooling the heated wafer W by, for example, a cooling plate. As a specific example of the thermal processing performed in the TCT module 16, a heating processing for curing the coating liquid may be exemplified.

The DEV module 17 is configured to perform a developing processing on an exposed resist film. The DEV module 17 incorporates a plurality of developing units (not illustrated), a plurality of thermal processing units (not illustrated), a conveyance arm A5 configured to convey a wafer W to these unit, and a direct conveyance arm A6 configured to convey a wafer W without passing these units. The developing unit is configured to form a resist pattern by partially removing the resist film. The thermal processing unit performs a thermal processing by heating the wafer W by, for example a hot plate, and cooling the heated wafer W by, for example, a cooling plate. As a specific example of the thermal processing performed in the DEV module 17, a heating processing before the developing processing (post exposure bake (PEB)), and a heating processing after the developing processing (post bake (PB)) may be exemplified.

A shelf unit U10 is provided at the carrier block 4 side within the processing block 5 (see, e.g., FIGS. 2 and 3). The shelf unit U10 is installed to reach the TCT module 16 from the floor, and partitioned into a plurality of cells arranged in the vertical direction. A lifting arm A7 is provided in the vicinity of the shelf unit U10. The lifting arm A7 moves up and down a wafer W among the cells of the shelf unit U10.

A shelf unit U11 is provided at the interface block 6 side within the processing block 5 (see, e.g., FIGS. 2 and 3). The shelf unit U11 is installed to reach the upper portion of the DEV module 17 from the floor, and partitioned into a plurality of cells arranged in the vertical direction.

The interface block 6 incorporates an exchange arm A8 and is connected to the exposure apparatus 3. The exchange arm A8 is configured to take out a wafer W from the shelf unit U11 so as to deliver the wafer W to the exposure apparatus 3 and to receive the wafer W from the exposure apparatus 3 so as to return the wafer W to the shelf unit U11.

[Configuration of Coating Unit]

Figure 4:
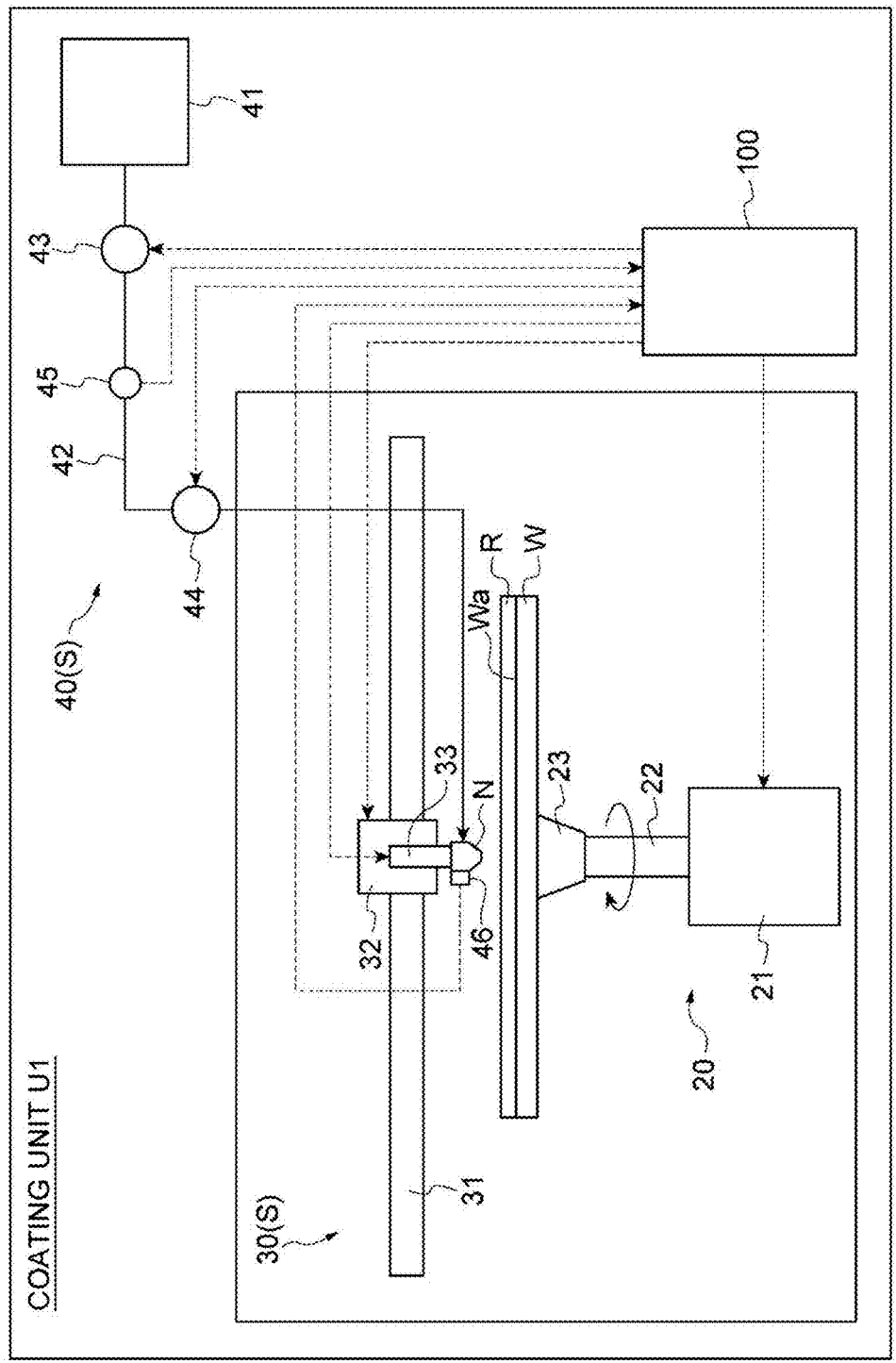
FIG. 4 is a schematic view illustrating a coating unit related to the first exemplary embodiment.
Figure 5:
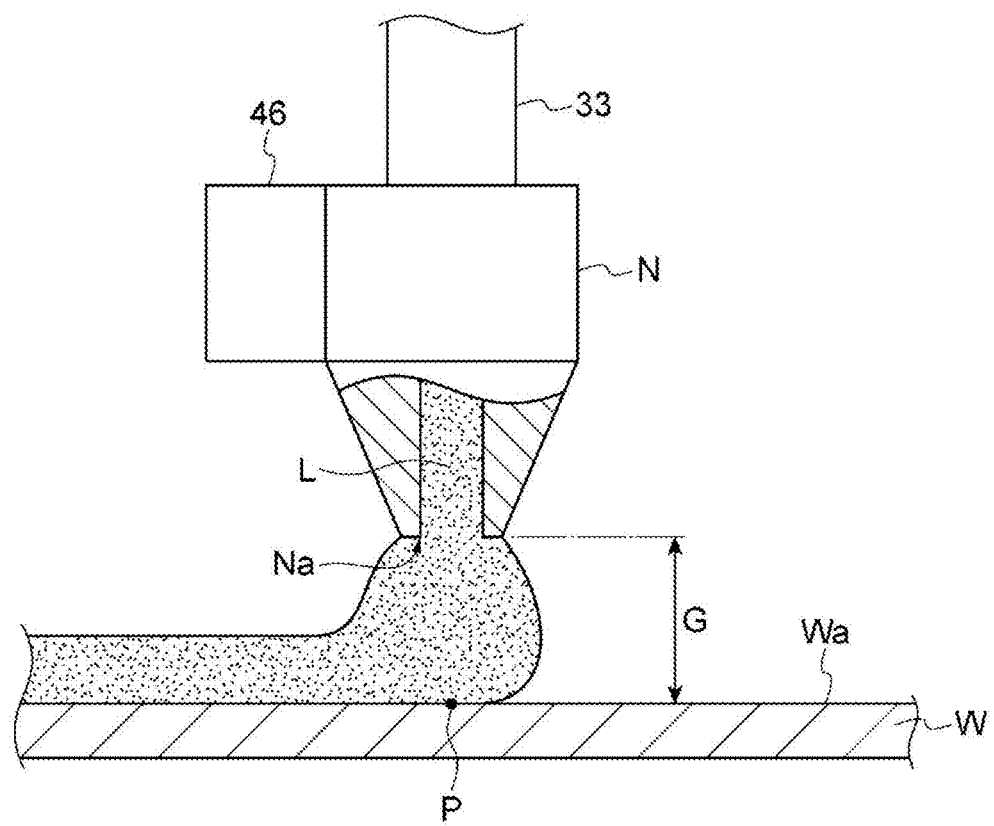
FIG. 5 is a schematic view illustrating the vicinity of a nozzle.

Subsequently, the coating unit (liquid coating apparatus) U1 will be described in more detail with reference to FIGS. 4 and 5. As illustrated in FIG. 4, the coating unit U1 is provided with a rotary holding unit 20, a liquid supply system S, and a control unit 100.

The rotary holding unit 20 includes a rotary unit 21 and a holding unit 23. The rotary unit 21 includes a shaft 22 protruding upwardly. The rotary unit 21 rotates the shaft 22, using, for example, an electric motor as a power source. The holding unit 23 is provided on a tip end of the shaft 22. A wafer W is horizontally mounted on the holding unit 23. The holding unit 23 holds the wafer W substantially horizontally by, for example, attraction. That is, the rotary holding unit 20 rotates the wafer W around an axis (rotary axis) perpendicular to a surface of the wafer W in a state where the posture of the wafer W is substantially horizontal. In the first exemplary embodiment, since the rotary axis passes through the center of the wafer W having a circular shape, the rotary axis may refer to as a central axis. As illustrated in FIG. 4, in the first exemplary embodiment, the rotary holding unit 20 rotates the wafer W clockwise when viewed from the top side.

The liquid supply system S includes a driving unit 30, and a liquid supply unit 40. The driving unit 30 is configured to drive a nozzle (ejection nozzle) N. The driving unit 30 includes a guide rail 31, a slide block 32, and an arm 33. The guide rail 31 extends in the horizontal direction in the upper side of the rotary holding unit 20 (wafer W). The slide block 32 is connected to the guide rail 31 to be capable of moving in the horizontal direction along the guide rail 31. The arm 33 is connected to the slide block 32 to be capable of moving in the vertical direction. The nozzle N is connected to the lower end of the arm 33. The driving unit 30 moves the slide block 32 and the arm 33, and hence the nozzle N, using, for example, an electric motor as a power source. When viewed from a plan view, the nozzle N moves in the radial direction of the wafer W on a straight line orthogonal to the rotary axis of the wafer W.

The liquid supply unit 40 includes a liquid storage unit 41, the nozzle N, a supply pipe 42, a pump 43, a valve 44, a flow rate sensor (flow rate measuring unit) 45, a distance sensor (distance measuring unit) 46. The liquid storage unit 41 stores a coating liquid L (see, e.g., FIG. 5). The nozzle N is disposed above the wafer W held on the holding unit 23. As illustrated in FIG. 5, the ejection port Na of the nozzle N is directed vertically downwardly. The nozzle N is connected to the liquid storage unit 41 via the supply pipe 42, and ejects the coating liquid L supplied from the liquid storage unit 41 downwardly to be supplied to the surface Wa. When the coating liquid L is dried, a coating film R (see, e.g., FIG. 4) is formed on the surface Wa of the wafer W.

The pump 43 is provided in the middle of the supply pipe 42 and feeds the coating liquid L from the liquid storage unit 41 to the nozzle N. The valve 44 is provided between the nozzle N and the pump 43 in the supply pipe 42. The valve 44 causes the ejection of the coating liquid L from the nozzle N to be initiated or stopped. The coating liquid L is a liquid for forming a coating film R on the surface Wa of the wafer W. As the coating liquid L, for example, a resist liquid for forming a resist pattern, a polyimide liquid for forming a polyimide film (a protection film) on the surface Wa of the wafer W to protect the circuit formed on the surface Wa of the wafer W, a liquid for forming an anti-reflection film (e.g., an underlayer anti-reflection coating (BARC) film, or a silicon containing anti-reflection coating (SiARC) film), a liquid for forming a SOG (Spin on Glass) film, a liquid for forming an underlayer film, an adhesive, or a liquid for forming a lens material may be exemplified. The resist liquid may be either a positive-type or a negative type. As the resist liquid, for example, an ArF photoresist liquid exposed by ArF excimer laser light, a KrF photoresist liquid exposed by KrF excimer laser light, a mid-UV (MUV) photoresist liquid exposed by Mid-UV, or a color resist liquid containing a pigment may be exemplified. The color resist liquid is used for manufacturing, for example, a color filter. As the adhesive, for example, a strong bonding type intended to bond bonding target objects not to be separated from each other or a temporary bonding type intended to temporarily bond bonding target objects to be separated each other after temporarily bonding the bonding target objects may be exemplified. The lower limit of the viscosity of the coating liquid L may be, for example, 1 cp, 200 cp, or 1000 cp. The upper limit of the viscosity of the coating liquid L may be, for example, 8000 cp. Among the coating liquids L exemplified above, for example, the ArF photoresist liquid, the KrF photoresist liquid, the MUV photoresist liquid, the liquid for forming an SOG film, the liquid for forming a BARC film, and the liquid for forming an underlayer film generally have a viscosity in the range of 1 cp to 200 cp, and are classified as low viscosity materials. Among the coating liquid L exemplified above, for example, the positive-type photoresist, the negative-type photoresist, the polyimide liquid, the adhesive, the color resist liquid, and the liquid for forming a lens material generally have a viscosity in the range of 200 cp to 8000 cp, and are classified as high viscosity materials. Although various coating liquids L are exemplified above, in the present exemplary embodiment, a high viscosity material having a viscosity of 200 cp or more may be properly used as the coating liquid L.

The flow rate sensor 45 is provided between the pump 43 and the valve 44 in the supply pipe 42. The flow rate sensor 45 measures the flow rate of the coating liquid L flowing in the supply pipe 42, that is, the flow rate of the coating liquid L before ejected from the nozzle N. That is, in the present exemplary embodiment, the physical quantity at the nozzle N that is ejecting the coating liquid L is the flow rate of the coating liquid L before ejected from the nozzle N. The distance sensor 46 measures the height position of the ejection port of the nozzle N with respect to the surface Wa of the wafer W, that is the separation distance (gap) G between the ejection port of the nozzle N and the surface Wa of the wafer W when the nozzle N is positioned above the surface Wa of the wafer W (see, e.g., FIG. 5). As for the distance sensor 46, for example, a laser displacement gauge may be used.

The control unit 100 is constituted with one or more control computers as illustrated in FIG. 4 and controls the coating unit U1. The control unit 100 includes a display unit (not illustrated) configured to display a control condition setting screen, an input unit (not illustrated) configured to input control conditions, and a reading unit (not illustrated) configured to read a program from a computer-readable storage medium. The storage medium stores a program for executing a film forming method in the coating unit U1. The program is read by the reading unit of the control unit 100. The storage medium may be, for example, a semiconductor memory, an optical recording disc, a magnetic recording disc, a magneto-optical recording disc. The control unit 100 controls the coating unit U1 according to a control condition input to the input unit and a program read by the reading unit.

[Functional Block of Control Unit]

Figure 6:
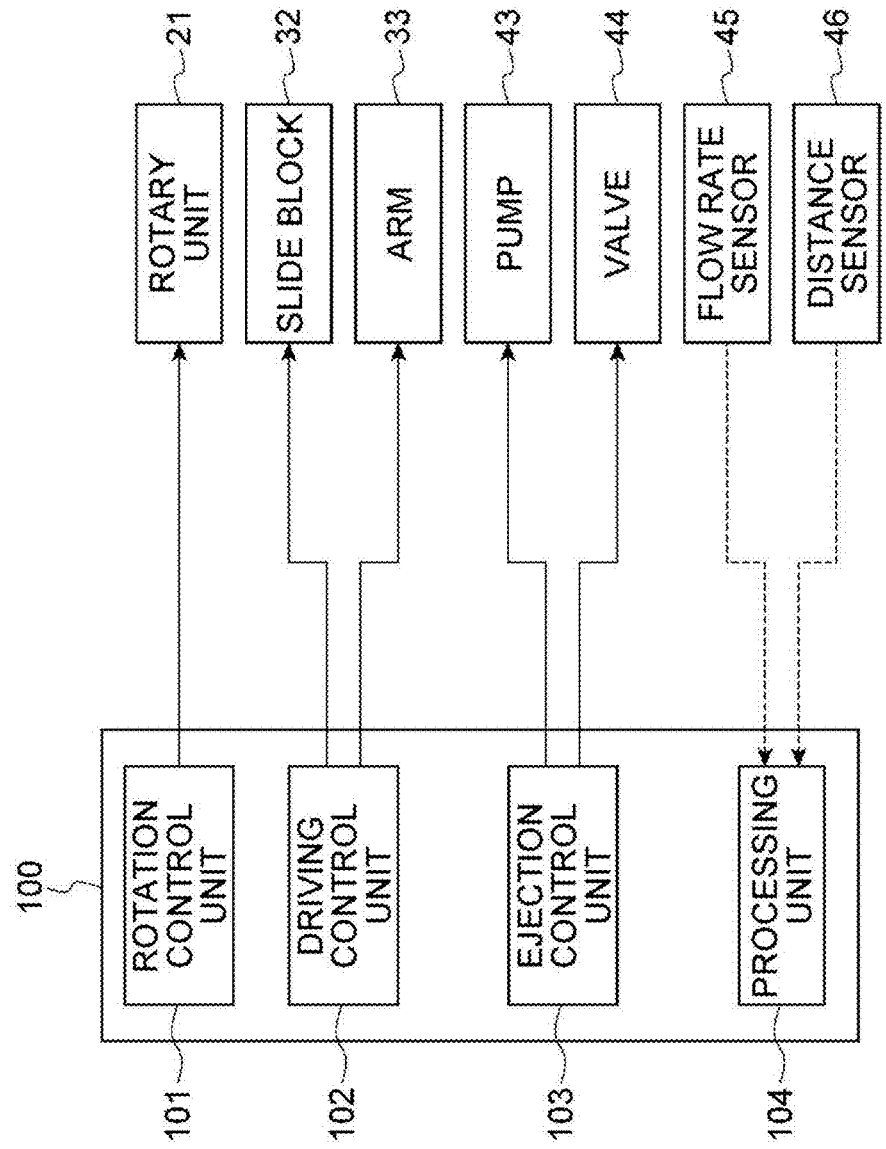
FIG. 6 is a block diagram illustrating a functional configuration of a control unit related to the first exemplary embodiment.

Subsequently, descriptions will be made on functions implemented when the control unit 100 executes programs with reference to FIG. 6. Hereinafter, individual function implemented by executing a program will be referred to as a "functional block." For that reason, the functional block is a virtual constituent element which does not physically exist. As functional blocks, the control unit 100 includes a rotation control unit 101, a driving control unit 102, an ejection control unit 103, and a processing unit 104.

The rotation control unit 101 controls the rotary unit 21 to rotate the wafer W at a predetermined number of rotations. Specifically, the rotation control unit 101 controls the rotary unit 21 in such a manner that as the ejection position P (see, e.g., FIG. 5) of the coating liquid L from the nozzle N is positioned closer to the peripheral edge of the wafer W in the surface Wa of the wafer W, the number of rotations of the wafer W is reduced. That is, the number of rotations of the wafer W when the ejection position P is positioned in the vicinity of the rotary axis of the wafer W is larger than the number of rotations of the wafer at the time when the ejection position P is positioned at the peripheral edge of the wafer W. The rotation control unit 101 controls the rotary unit 21 to make a linear velocity constant, in which the linear velocity is determined form the product of the distance of the ejection position P from the center (rotary axis) of the wafer W and the number of rotations at the ejection position P.

The driving control unit 102 controls the slide block 32 to move the nozzle N in a predetermined direction (horizontal direction) along the surface Wa of the wafer W between the rotary axis and the peripheral edge of the wafer W. The driving control unit 102 may move the nozzle N in a direction from the center of the wafer W toward the peripheral edge of the wafer W, in a direction from the peripheral edge of the wafer W toward the center of the wafer W, or in a direction from the peripheral edge of the wafer W through the center of the wafer W and then toward the peripheral edge of the wafer W again.

The driving control unit 102 controls the arm 33 to raise or lower the nozzle N along the vertical direction. As a result, the ejection port Na of the nozzle N comes close to or separates from the surface Wa of the wafer W so that the gap G is changed.

Figure 7:
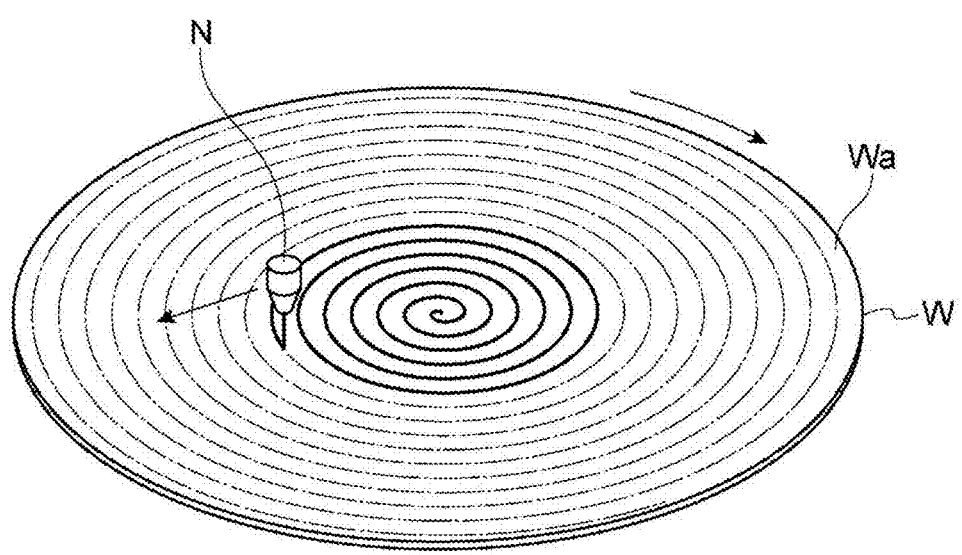
FIG. 7 is a schematic view illustrating a state where a coating liquid ejected from a nozzle is coated on a surface of a substrate.

The ejection control unit 103 controls the pump 43 and the valve 44 to eject the coating liquid L from the ejection port Na of the nozzle N. That is, the ejection control unit 103 controls ON/OFF of the coating liquid L from the nozzle N. When the ejection control unit 103 causes the coating liquid L to be ejected to the surface Wa of the wafer W from the nozzle N while the driving control unit 102 is moving the nozzle N in the horizontal direction above the surface Wa of the wafer W and the rotation control unit 101 is rotating the wafer W, the coating liquid L is coated in a spiral form on the surface Wa of the wafer W as illustrated in FIG. 7. In FIG. 7, the solid line indicates a portion where the coating liquid L is coated, and the chain line indicates a portion where the coating liquid L will be coated from now on. The time required for coating of the entire surface Wa of the wafer W may be variable depending on the size of the wafer W and is, for example, 10 sec to 300 sec.

The processing unit 104 receives the flow rate measured by the flow rate sensor 45 and the gap G measured by the distance sensor 46 as data. The processing unit 104 controls the rotation control unit 101 or the driving control unit 102 based on the data.

Figure 8:
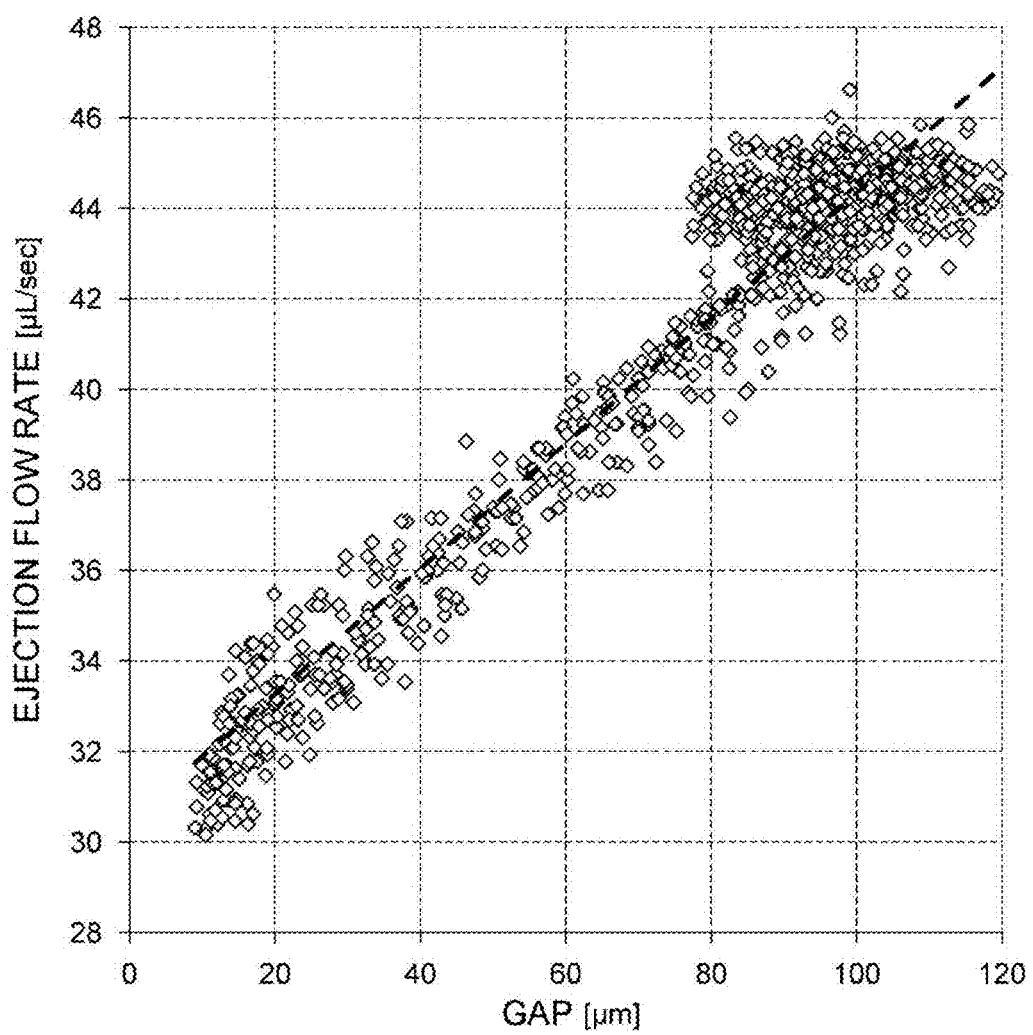
FIG. 8 is a graph representing a relationship between a gap and an ejection flow rate.

Here, a relation between the gap G and the flow rate of the coating liquid L ejected from the nozzle N (hereinafter, simply referred to as "ejection flow rate" will be described with reference to FIG. 8. Respective points in FIG. 8 indicate results obtained by measuring the ejection flow rate by the flow rate sensor 45 when only the gap G was changed. As illustrated in FIG. 8, the distribution of respective points has a positive correlation. Accordingly, when a control is performed such that the ejection flow rate becomes a predetermined target value, the gap G can be constantly controlled. In addition, the broken line in FIG. 8 is a linear approximate straight line of respective points.

Thus, when the flow rate measured by the flow rate sensor 45 becomes larger than the target value, it means that the gap G has a value larger than a desired value. Thus, the processing unit 104 outputs an instruction to lower the arm 33 to the driving control unit 102. As a result, the nozzle N is brought close to the surface Wa of the wafer W and thus the gap G decreases. Meanwhile, when the flow rate measured by the flow rate sensor 45 becomes smaller than the target value, it means that the gap G has a value smaller than the desired value. Thus, the processing unit 104 outputs an instruction to raise the arm 33 to the driving control unit 102. As a result, the nozzle N is brought away from the surface Wa of the wafer W and thus the gap G increases.

Figure 9:
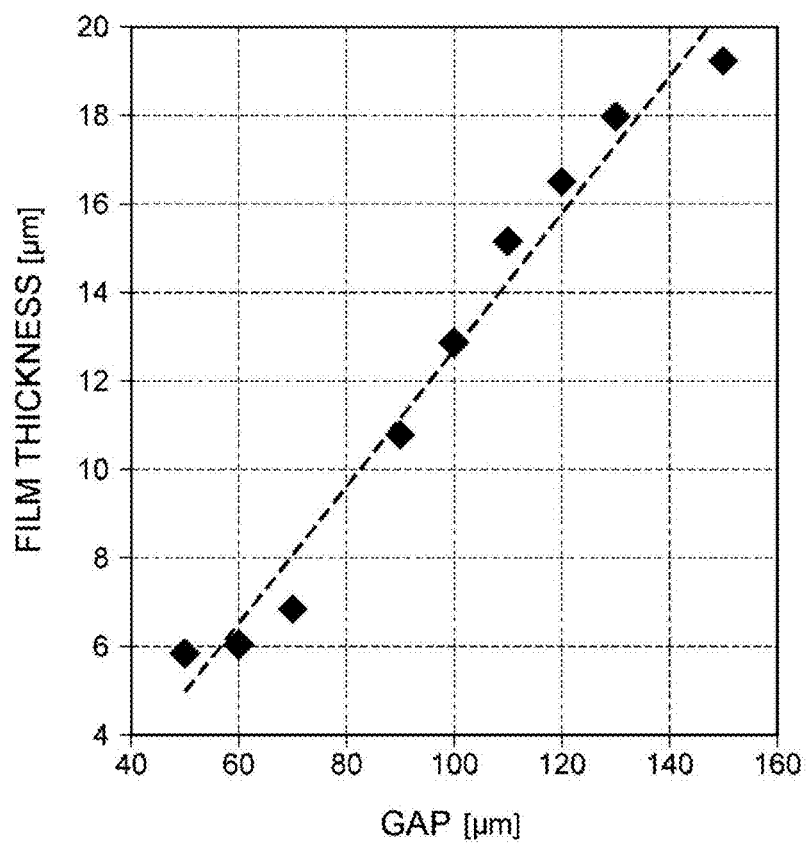
FIG. 9 is a graph representing a relationship between a gap and a film thickness of a coating film.

In addition, a relation between the gap G and a film thickness of a coating film R formed on the surface Wa of the wafer W (hereinafter, simply referred to as a "film thickness") will be described with reference to FIG. 9. Respective points in FIG. 9 indicate results obtained by measuring the film thickness using a film thickness sensor when only the gap G is changed. As illustrated in FIG. 9, a positive correlation exists between the gap G and the film thickness in that as the gap G increases, the film thickness also increases. The straight line indicated by a broken line in FIG. 9 is an approximate straight line (regression line) of respective points of FIG. 9.

With this functional configuration, the control unit 100 related to the first exemplary embodiment executes: coating the coating liquid L on the surface Wa of the wafer W in a spiral form by causing the liquid supply unit 40 to eject the coating liquid L from the nozzle N while causing the driving unit 30 to move the nozzle N in a predetermined direction along the surface Wa of the wafer W between the rotary axis and the peripheral edge of the wafer W when the rotary holding unit 20 is rotating the wafer W; making a linear velocity at an ejection position P of the coating liquid L from the nozzle N substantially constant by causing the rotary holding unit 20 to rotate the wafer W in such a manner that, as the ejection position P on the surface Wa of the wafer W is positioned closer to the peripheral edge side of the wafer, the number of rotations of the wafer W is reduced; and making the ejection flow rate of the coating liquid L ejected from the nozzle N substantially constant by causing the driving unit 30 to raise or lower the nozzle N so as to change the gap G between the ejection port Na of the nozzle N and the surface Wa of the wafer W.

[Operation of Coating/Developing Apparatus]

Next, an outline of an operation of the coating/developing apparatus 2 will be described. The coating/developing apparatus 2 performs coating/developing processings in the following sequence. First, the coating/developing apparatus 2 forms an underlayer film, a resist film, and an upper-layer film on the surface of the wafer W. Respective elements of the coating/developing apparatus 2 are operated as follows. That is, the exchange arm A1 conveys the wafer W within the carrier 11 to the shelf unit U10. The lifting arm A7 arranges the wafer W in a cell for the BCT module 14, and the conveyance arm A2 conveys the wafer W to each unit within the BCT module 14. The coating unit coats the coating liquid for forming the underlayer film on the surface Wa of the wafer W. The thermal processing unit performs, for example, a heating processing for curing the coating liquid.

When the formation of the underlayer film is completed, the conveyance arm A2 returns the wafer W to the shelf unit U10. The lifting arm A7 arranges the wafer W in a cell for the COT module 15, and the conveyance arm A3 conveys the wafer W to each unit within the COT module 15. The coating unit U1 coats a resist composition (coating liquid L) on the surface Wa of the wafer W. At this time, each functional block of the control unit 100 is operated so that the resist composition (coating liquid L) is coated in a spiral form on the surface Wa of the wafer W, and the resist composition (coating liquid L) is ejected from the nozzle N in a substantially constant ejection flow rate. The thermal processing unit U2 performs, for example, a heating processing (PAB) for curing the resist composition.

When the formation of the resist film is completed, the conveyance arm A3 returns the wafer W to the shelf unit U10. The lifting arm A7 arranges the wafer W in a cell for the TCT module 16, and the conveyance arm A4 conveys the wafer W to each unit within the TCT module 16. The coating unit coats a coating liquid forming the upper-layer film on the surface Wa of the wafer W. The thermal processing unit performs, for example, a heating processing for curing the coating liquid. When the formation of the upper-layer film is completed, the conveyance arm A4 returns the wafer W to the shelf unit U10.

Next, the coating/developing apparatus 2 discharges the wafer W to the exposure apparatus 3. The respective elements of the coating/developing apparatus 2 are operated as follows. That is, the lifting arm A7 arranges the wafer W returned to the shelf unit U10 by the conveyance arm A4 to a cell for the DEV module 17, and the direct conveyance arm A6 conveys the wafer W to the shelf unit U11. The exchange arm A8 discharges the wafer W to the exposure apparatus 3. When the exposure processing in the exposure apparatus 3 is completed, the exchange arm A8 receives the wafer W from the exposure apparatus 3 and returns the wafer W to the shelf unit U11.

Next, the coating/developing apparatus 2 performs the developing processing of the resist film. The respective elements of the coating/developing apparatus 2 are operated as follows. That is, the conveyance arm A5 conveys the wafer W of the shelf unit U11 to the thermal processing unit within the DEV module 17. The thermal processing unit performs a heating processing (PEB) of the wafer W. When the PEB is completed, the conveyance arm A5 conveys the wafer W to the developing unit. The developing unit supplies a developing solution and a rinse liquid to the surface Wa of the wafer W so as to perform the developing processing of the resist film. When the developing processing is completed, the conveyance arm A5 conveys the wafer W to the thermal processing unit again. The thermal processing unit performs the heating processing (PB) of the wafer W. When the PB is completed, the conveyance arm A5 conveys the wafer W to the shelf unit U10. The lifting arm A7 arranges the wafer W in a cell for exchange, and the exchange arm A1 returns the wafer W to the inside of the carrier 11. Thus, the coating/developing processing is completed.

In the first exemplary embodiment as described above, the ejection flow rate of the coating liquid L is made to be substantially constant by changing the gap G between the ejection port Na of the nozzle N and the surface Wa of the wafer W while making the linear velocity at the ejection position P substantially constant. Thus, the amount of the ejected coating liquid L becomes substantially equal at any ejection position P. In addition, in the first exemplary embodiment, the coating liquid L is coated in the spiral form on the surface Wa of the wafer W. Thus, the coating liquid L ejected from the nozzle N hardly overlaps on the surface Wa of the wafer W. As a result, on the entire surface Wa of the wafer W, the film thickness of the coating film R formed by the coating liquid L coated on the surface Wa of the wafer W becomes substantially uniform. Moreover, since the gap G between the ejection port Na of the nozzle N and the surface Wa of the wafer W can be instantly changed while the coating liquid L is ejected to the surface Wa of the wafer W, the change of the posture of the substrate which is caused when transferring the substrate may not be considered. As a result, it becomes possible to further uniformize the film thickness of the coating film R formed on the surface Wa of the wafer W. In particular, in the case where the coating liquid L is the resist composition, it becomes possible to form a resist film having a substantially uniform film thickness on the surface Wa of the wafer W so that a desired resist pattern can be obtained by uniformly exposing and developing the resist film.

In the first exemplary embodiment, the driving unit 30 moves the nozzle N upward or downward so as to change the gap G between the ejection port Na of the nozzle N and the surface Wa of the wafer W based on the flow rate measured by the flow rate sensor 45. Thus, the gap G between the ejection port Na and the nozzle N and the surface Wa of the wafer W can be changed quickly and reliably by performing a feedback control so that the flow rate measured by the flow rate sensor 45 comes close to a predetermined size. In particular, it may be considered that when the nozzle N is driven by the driving unit 30, the nozzle N vibrates up and down which may cause the variation in the film thickness. However, with the feedback control using the flow rate sensor 45, the gap G can be controlled following the vibration.

Second Exemplary Embodiment

Regarding a second exemplary embodiment, descriptions will be made with reference to FIGS. 10 and 11 and FIGS. 12A to 12C, mainly focusing on the difference between the first exemplary embodiment and the second exemplary embodiment.

The substrate processing system 1 further includes a measuring unit U3 in addition to the coating unit U1. The coating unit U1 is the same as that of the first exemplary embodiment, except that the coating unit U1 does not include the distance sensor 46.

Figure 10:
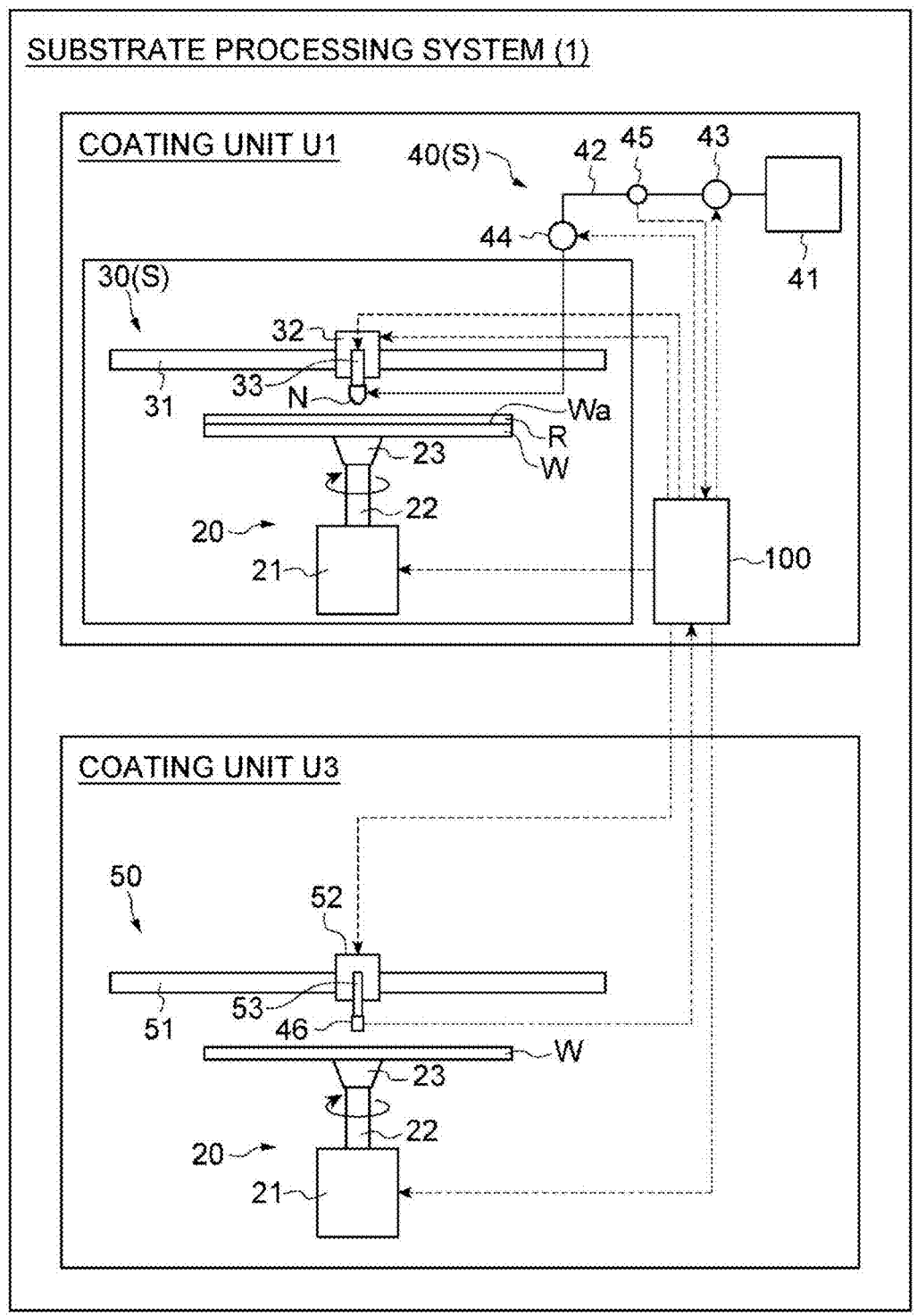
FIG. 10 is a schematic view illustrating a substrate processing system related to a second exemplary embodiment.

The measuring unit U3 is configured to measure an in-plane shape of the wafer W. The measuring unit U3 may be embedded in the COT module 15 like the coating unit U1, but may be disposed at any place within the substrate processing system 1. As illustrated in FIG. 10, the measuring unit U3 includes a rotary holding unit 20 and a driving unit 50. The configuration of the rotary holding unit 20 is the same as that of the first exemplary embodiment.

The driving unit 50 is configured to drive the distance sensor 46. The driving unit 50 includes a guide rail 51, a slide block 52, and an arm 53. The guide rail 51 extends in a horizontal direction at the upper side of the rotary holding unit 20 (wafer W). The slide block 52 is connected to the guide rail 51 to be slidable in the horizontal direction along the guide rail 51. The arm 53 is connected to the slide block 52 so as to extend downwardly. The distance sensor 46 is connected to the lower end of the arm 53. The driving unit 50 moves the slide block 52 using, for example, an electric motor as a power source, and as a result, moves the distance sensor 46. On a plan view, the distance sensor 46 moves in a radial direction of the wafer W on a straight line orthogonal to the rotary axis of the wafer W. As a result, the height position of the surface Wa of the wafer W is measured by the distance sensor 46.

Figure 11:
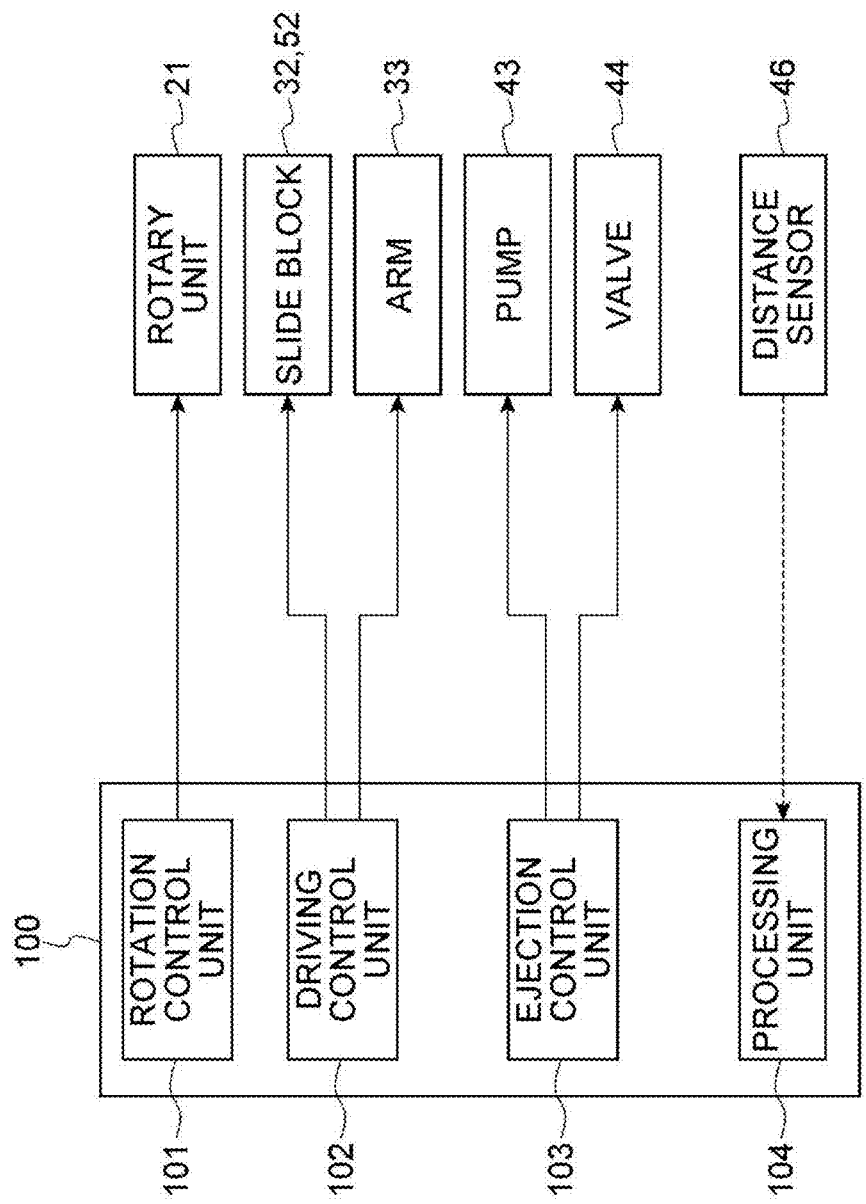
FIG. 11 is a block diagram illustrating a functional configuration of a control unit related to the second exemplary embodiment and third exemplary embodiment.

The rotary holding unit 20 and the driving unit 50 of the measuring unit U3 is controlled by the control unit 100 of the coating unit U1. The control unit 100 is different from that of the first exemplary embodiment in that, as illustrated in FIG. 11, the driving control unit 102 further controls the slide block 52, and the processing unit 104 performs a processing based on the input from the distance sensor 46. The measuring unit U3 may further include a control unit, and the control unit of the measuring unit U3 and the control unit 100 of the coating unit U1 may communicate with each other to perform the control of the measuring unit U3 and the coating unit U1. The coating unit U1 may not include the control unit 100, and both the coating unit U1 and the measuring unit U3 may be controlled by a control unit provided outside the coating unit U1 and the measuring unit U3. That is, the number of control units that control the coating unit U1 and the measuring unit U3 and the number of locations where the control units are installed are not particularly limited.

The rotation control unit 101 controls the respective rotary units 21 of the coating unit U1 and the measuring unit U3. The driving control unit 102 controls the slide block 52 to move the distance sensor 46 in a predetermined direction (horizontal direction) along the surface Wa of the wafer W between the rotary axis and the peripheral edge of the wafer W.

The processing unit 104 receives height positions of the surface Wa of the wafer W measured by the distance sensor 46, and positional coordinates of the distance sensor 46 in the horizontal plane, in which the height position of each of the positional coordinates is measured, as height position data and positional coordinate data, respectively. The processing unit 104 associates and acquires the height position data and positional coordinate data as data (in-plane shape data) in which the height positions of the surface Wa of the wafer W are mapped. Based on the in-plane shape data, the processing unit 104 controls the rotation control unit 101 or the driving control unit 102.

With the functional configuration as described above, the control unit 100 related to the second exemplary embodiment executes processings of: coating the coating liquid L in a spiral form on the surface Wa of the wafer W by causing the liquid supply unit 40 to eject the coating liquid L from the nozzle N while causing the driving unit 30 to move the nozzle N in a predetermined direction along the surface Wa of the wafer W between the rotary axis and the peripheral edge of the wafer W while the rotary holding unit 20 rotates the wafer W; making the linear velocity at an ejection position P substantially constant by causing the rotary holding unit 20 to rotate the wafer W in such a manner that, as the ejection position of the coating liquid L from the nozzle N is positioned nearer to the peripheral edge of the wafer W in the surface Wa of the wafer W, the number of rotations of the wafer W is reduced; and making the ejection flow rate of the coating liquid L ejected from the nozzle N substantially constant by causing the driving unit 30 to move the nozzle N upward or downward so that the height position of the ejection port Na of the nozzle N with respect to the surface Wa of the wafer W is changed based on the previously acquired in-plane shape of the surface Wa of the wafer W.

Next, the outline of the operations of the coating unit U1 and the measuring unit U3 will be described with reference to FIGS. 12A to 12C. First, a wafer W is conveyed to the inside of the measuring unit U3 by a predetermined conveyance arm. When the wafer W is held on the holding unit 23 of the measuring unit U3, the rotation control unit 101 and the driving control unit 102 of the control unit 100 are operated such that a processing of rotating the wafer W and a processing of moving the distance sensor 46 are performed (see FIG. 12A). As such, when the height position data and the positional coordinate data are transmitted from the distance sensor 46 to the processing unit 104, the processing unit 104 of the control unit 100 is operated such that a processing of acquiring the in-plane shape data of the surface Wa of the wafer W is performed (see FIG. 12B). In FIG. 12B, for example, a darker color indicates a lower height position of the surface Wa of the wafer W and a lighter color indicates a higher height position of the surface Wa of the wafer W. That is, in the example illustrated in FIG. 12B, at the central portion of the wafer W held by the holding unit 23, the height position of the surface Wa of the wafer W is lowered. In other words, the wafer W held by the holding unit 23 exhibits a basin shape which is recessed downward toward the central portion of the wafer W.

Subsequently, the wafer W is conveyed into the coating unit U1 by a predetermined conveyance arm. In the coating unit U1, while the height position of the ejection port Na of the nozzle N is controlled by the driving control unit 102 through the arm 33 based on the in-plane shape data acquired in the measuring unit U such that the gap G between the surface Wa of the wafer W and the ejection port Na of the nozzle N becomes substantially constant, the coating liquid L is coated on the surface Wa of the wafer W (see FIG. 12C).

Specifically, the control for making the gap G substantially constant is performed as follows. With reference to the in-plane shape data stored in the processing unit 104, the height position data Hw of the surface Wa of the wafer W corresponding to positional coordinates of the nozzle N in the horizontal plane is read. The processing unit 104 adds the size Hg of the gap G set to a predetermined value to the height position data Hw, to calculate the height position Hn of the ejection port Na of the nozzle N (Hn=Hw+Hg). The driving control unit 102 controls the arm 33 so as to position the ejection port Na of the nozzle N at the height position Hn. As a result, the height of the ejection port Na of the nozzle N is controlled such that the gap G has a substantially constant size Hg.

In the second exemplary embodiment as described above, the gap G between the surface Wa of the wafer W and the ejection port Na of the nozzle N is made to be substantially constant in size by changing the height position of the ejection port Na of the nozzle N with respect to the surface Wa of the wafer W based on the previously acquired in-plane shape of the surface Wa of the wafer W while making the linear velocity at the ejection position P substantially constant. Thus, the quantity of the ejected coating liquid L becomes substantially equal at any ejection position P. In addition, in the second exemplary embodiment, the coating liquid L is coated in a spiral form on the surface Wa of the wafer W. Thus, the coating liquid L ejected from the nozzle N hardly overlaps on the surface Wa of the wafer W. From the foregoing, the film thickness of the coating film R formed as the coating liquid L is coated on the surface Wa of the wafer W becomes substantially uniform over the entire surface Wa of the wafer W.

In the second exemplary embodiment, the measurement of the in-plane shape is performed in a processing chamber (measuring unit U3) that is different from the coating unit U1 where the coating processing is performed, prior to the coating processing. For that reason, the coating processing and the measurement of the in-plane shape may be performed simultaneously in different processing chambers. For that reason, the entire processing time can be shortened.

Third Exemplary Embodiment

Figure 12:
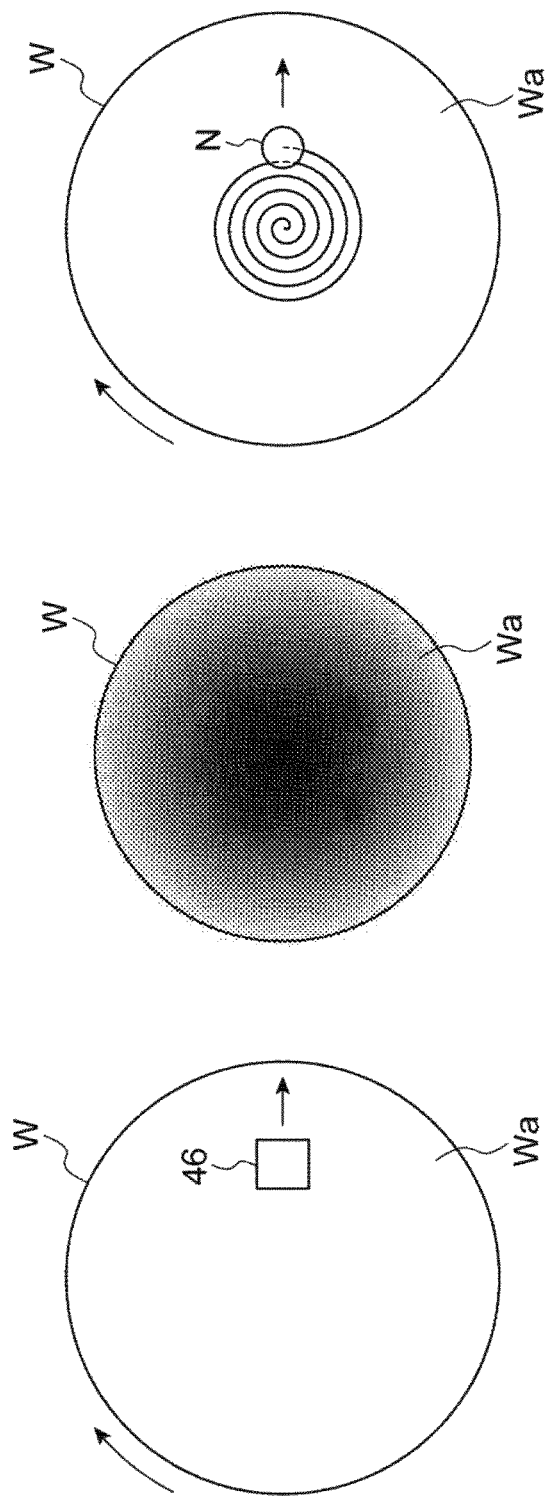
FIGS. 12A to 12C are views for describing a measurement processing and a coating processing in the second exemplary embodiment.

A third exemplary embodiment will be described with reference to FIGS. 11 to 13, focusing on the differences between the third exemplary embodiment and the first exemplary embodiment.

Figure 13:
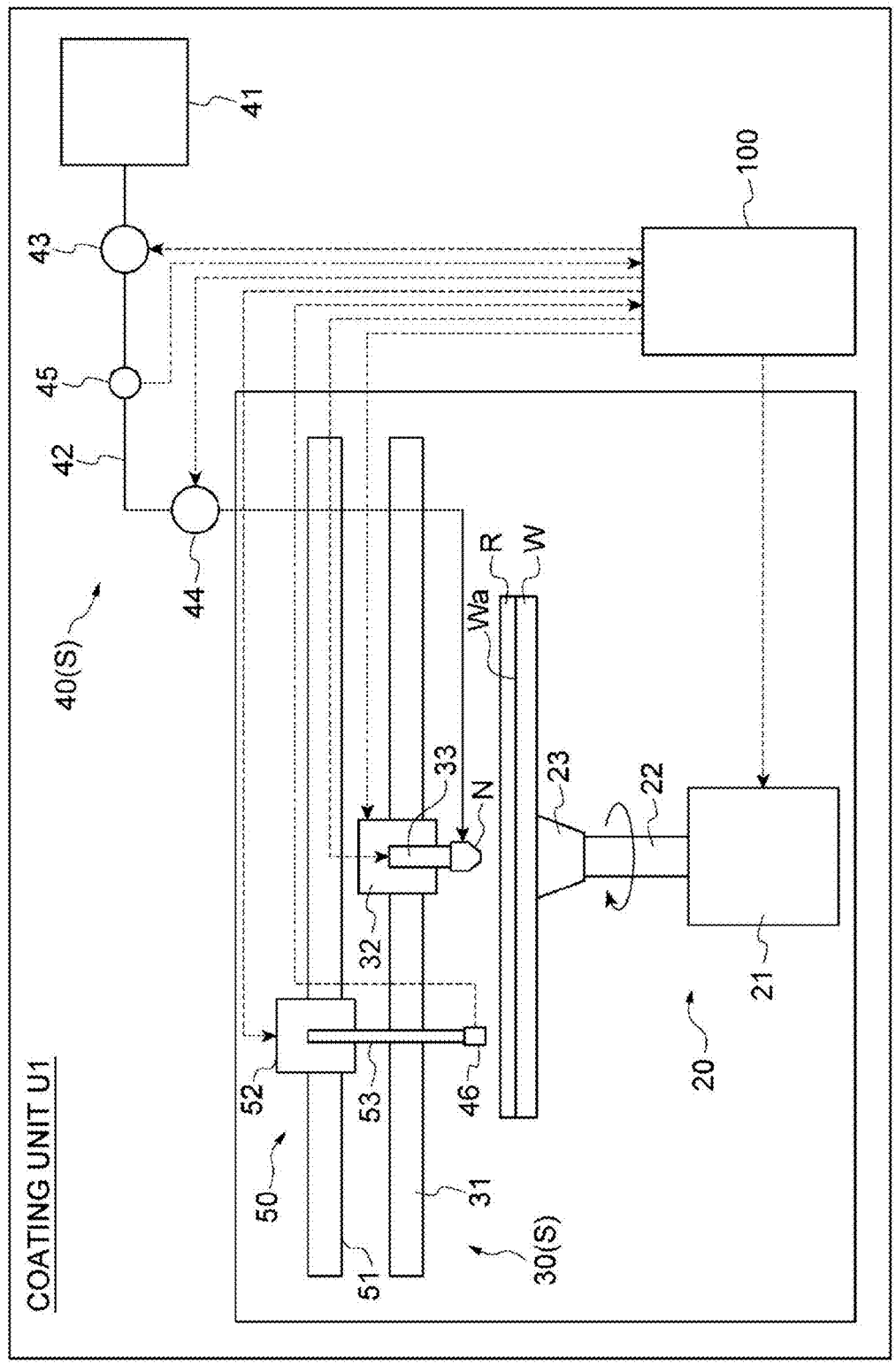
FIG. 13 is a schematic view illustrating a coating unit related to the third exemplary embodiment.

As illustrated in FIG. 13, the coating unit U1 is different from that of the first exemplary embodiment in that the coating unit U1 further includes a driving unit 50. The driving unit 50 is configured to drive the distance sensor 46. The driving unit 50 includes a guide rail 51, a slide block 52, and an arm 53. The guide rail 51 extends in a horizontal direction above the rotary holding unit 20 (wafer W). The slide block 52 is connected to the guide rail 51 to be movable in the horizontal direction along the guide rail 51. The arm 53 is connected to the slide block 52 to extend downwardly. At the lower end of the arm 53, the distance sensor 46 is connected. The driving unit 50 moves the slide block 52 using, for example, an electric motor as a power source, and hence moves the distance sensor 46. In a plan view, the distance sensor 46 moves along a radial direction of the wafer W on a straight line orthogonal to the rotary axis of the wafer W. As a result, the height position of the surface Wa of the wafer W is measured by the distance sensor 46. In this way, in the third exemplary embodiment, the nozzle N and the distance sensor 46 may be independently moved by the driving units 30 and 50, respectively.

As illustrated in FIG. 11, the control unit 100 is different from that of the first exemplary embodiment in that the driving control unit 102 further controls the slide block 52 and the processing unit 104 performs a processing based on the input from the distance sensor 46. The driving control unit 102 controls the slide block 52 to move the distance sensor 46 in a predetermined direction (horizontal direction) along the surface Wa of the wafer W between the rotary axis and the peripheral edge of the wafer W.

The processing unit 104 receives height positions of the surface Wa of the wafer W measured by the distance sensor 46 and positional coordinates of the distance sensor 46 in the horizontal plane, in which the height position of each of the positional coordinates is measured, as height position data and positional coordinate data, respectively. The processing unit 104 associates and acquires the height position data and the positional coordinate data as data (in-plane shape data) in which the height positions of the surface Wa of the wafer W are mapped. The processing unit 104 controls the rotation control unit 101 or the driving control unit 102 based on the in-plane shape data.

With the functional configuration described above, the control unit 100 related to the third exemplary embodiment executes processings of: coating the coating liquid L in a spiral form on the surface Wa of the wafer W by causing the liquid supply unit 40 to eject the coating liquid L from the nozzle N while causing the driving unit 30 to move the nozzle N in a predetermined direction along the surface Wa of the wafer W between the rotary axis and the peripheral edge of the wafer W while the rotary holding unit 20 rotates the wafer W; making the linear velocity at an ejection position P substantially constant by causing the rotary holding unit 20 to rotate the wafer W in such a manner that, as the ejection position of the coating liquid L from the nozzle N is positioned nearer to the peripheral edge of the wafer W in the surface Wa of the wafer W, the number of rotations of the wafer W is reduced; and making the ejection flow rate of the coating liquid L ejected from the nozzle N substantially constant by causing the driving unit 30 to move the nozzle N upward or downward so that the height position of the ejection port Na of the nozzle N with respect to the surface Wa of the wafer W is changed based on the previously acquired in-plane shape of the surface Wa of the wafer W.

Next, the outline of the operations of the coating unit U1 will be described with reference to FIGS. 12A to 12C. First, a wafer W is conveyed to the inside of the coating unit U1 by a predetermined conveyance arm. When the wafer W is held on the holding unit 23 of the coating unit U1, the rotation control unit 101 and the driving control unit 102 of the control unit 100 are operated such that a processing of rotating the wafer W and a processing of moving the distance sensor 46 are performed (see FIG. 12A). As such, when the height position data and the positional coordinate data are transmitted from the distance sensor 46 to the processing unit 104, the processing unit 104 of the control unit 100 is operated such that a processing of acquiring the in-plane shape data of the surface Wa of the wafer W is performed (see FIG. 12B). Subsequently, while the height position of the ejection port Na of the nozzle N is controlled by the driving control unit 102 through the arm 33 based on the previously acquired in-plane shape data such that the gap G between the surface Wa of the wafer W and the ejection port Na of the nozzle N becomes substantially constant, the coating liquid L is coated on the surface Wa of the wafer W (see FIG. 12C). The control for making the gap G substantially constant is the same as that in the second exemplary embodiment.

In the third exemplary embodiment as described above, the gap G between the surface Wa of the wafer W and the ejection port Na of the nozzle N is made to be substantially constant in size by changing the height position of the ejection port Na of the nozzle with respect to the surface Wa of the wafer W based on the previously acquired in-plane shape of the surface Wa of the wafer W while making the linear velocity at the ejection position P substantially constant. Thus, the quantity of the ejected coating liquid L becomes substantially equal at any ejection position P. In addition, in the third exemplary embodiment, the coating liquid L is coated in a spiral form on the surface Wa of the wafer W. Thus, the coating liquid L ejected from the nozzle N hardly overlaps on the surface Wa of the wafer W. From the foregoing, the film thickness of the coating film R formed as the coating liquid L is coated on the surface Wa of the wafer W becomes substantially uniform over the entire surface Wa of the wafer W.

In the third exemplary embodiment, the measurement of the in-plane shape is performed in the coating unit U1 which is the chamber where the coating processing is performed, prior to the coating processing. For that reason, the coating processing and the measurement of the in-plane shape may be performed in the same processing chamber. Accordingly, since it is not necessary to provide a processing chamber according to each processing, the miniaturization of the substrate processing system 1 can be achieved.

Fourth Exemplary Embodiment

The fourth exemplary embodiment will be described with reference to FIG. 11, and FIGS. 14 to 16, focusing on the differences between the fourth exemplary embodiment and the first exemplary embodiment.

Figure 14:
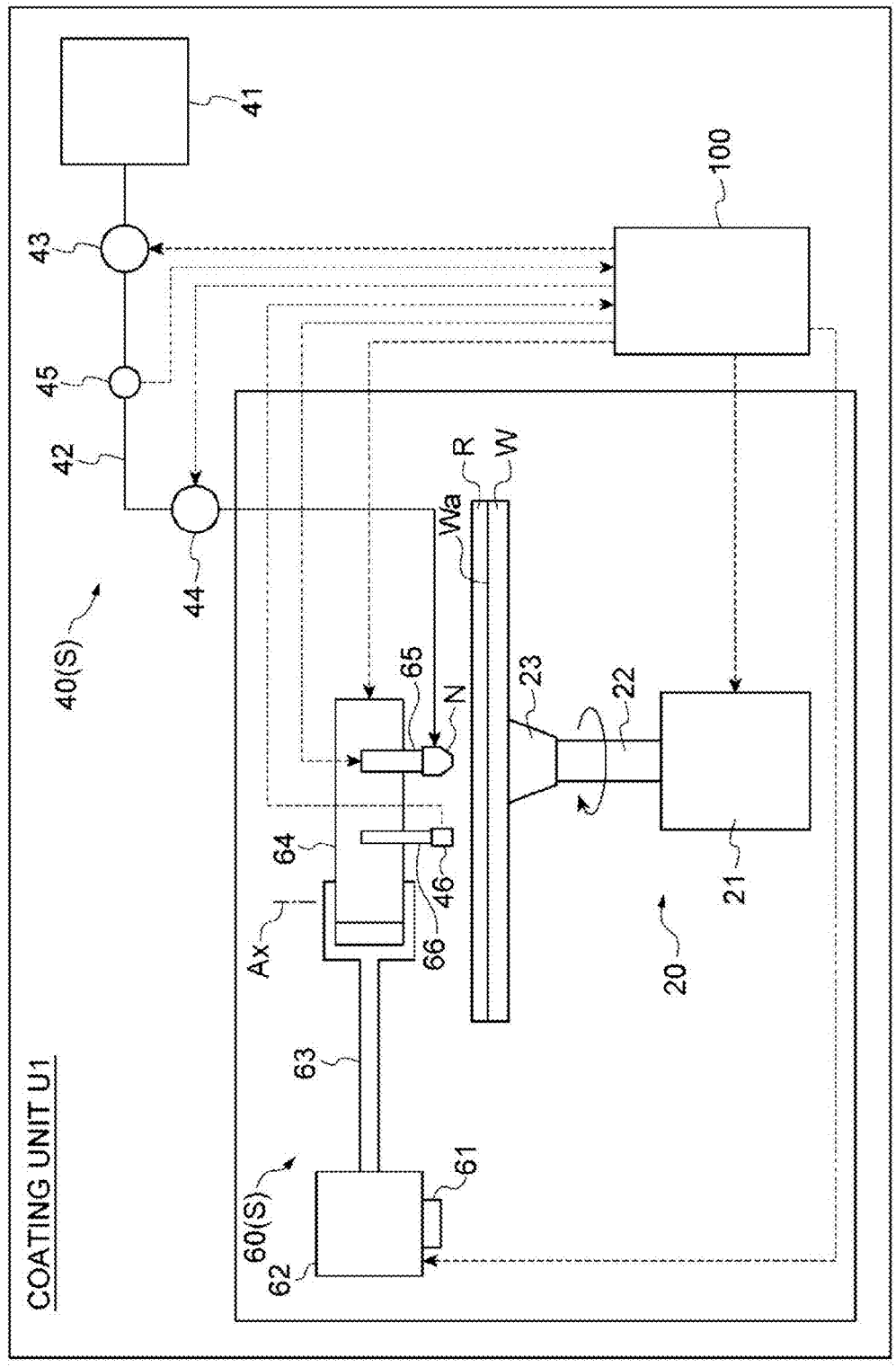
FIG. 14 is a schematic view illustrating a coating unit related to a fourth exemplary embodiment.
Figure 15:
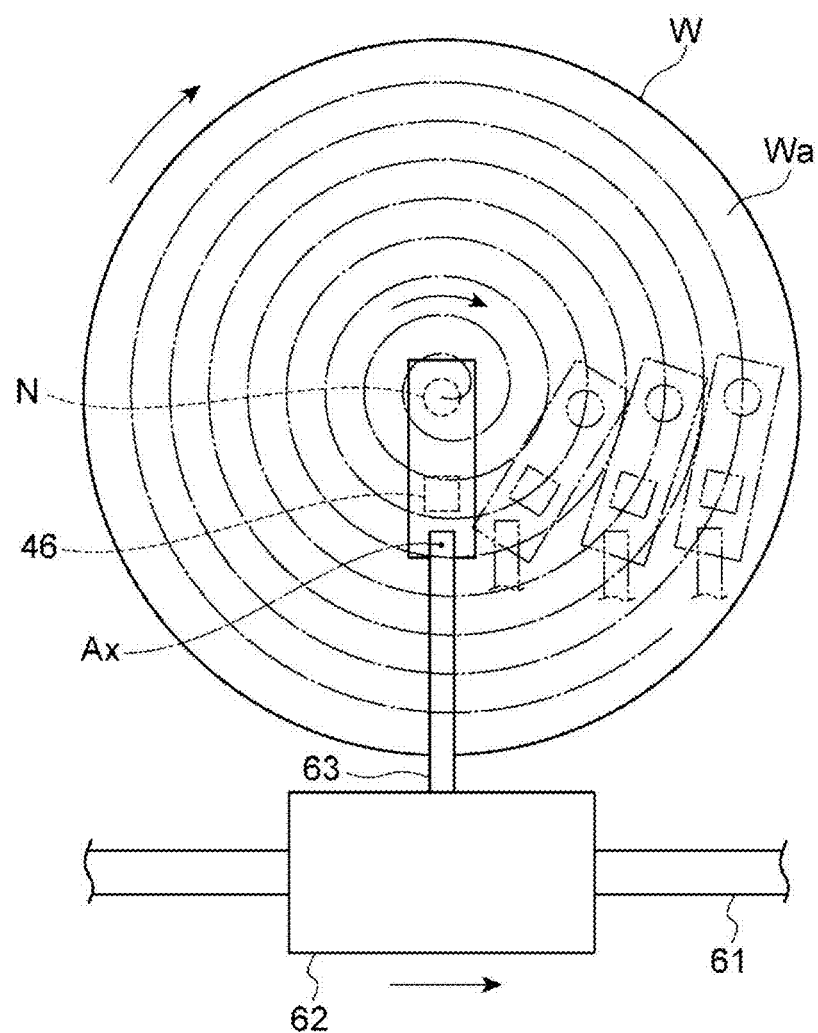
FIG. 15 is a view for describing a scanning state of a distance sensor and a nozzle in the coating unit related to the fourth exemplary embodiment.

As illustrated in FIGS. 14 and 15, the coating unit U1 is different from that of the first exemplary embodiment in that the coating unit U1 includes a driving unit 60 instead of the driving unit 30. The driving unit 60 is included in the liquid supply system S. The driving unit 60 includes a guide rail 61, a slide block 62, a support arm 63, a rotary head 64, and arms 65 and 66.

The guide rail 61 extends in a horizontal direction at a position where it does not overlap with the wafer W in the vertical direction. The guide rail 61 is positioned above the wafer W held on the rotary holding unit 20. The slide block 62 is connected to the guide rail 61 to be movable in the horizontal direction along the guide rail 61. The support arm 63 extends in the horizontal direction from the slide block 62 toward the rotary holding unit 20. The base end of the support arm 63 is connected to the slide block 62.

The rotary head 64 is connected to the tip end of the support arm 63. The rotary head 64 is configured to be rotatable around a vertical axis Ax. The arm 65 is connected to the rotary head 64 to be movable in the vertical direction. At the lower end of the arm 65, the nozzle N is connected. The arm 66 is connected to the rotary head 64 to extend downwardly. At the lower end of the arm 66, the distance sensor 46 is connected.

The nozzle N and the distance sensor 46 are rotated as the rotary head 64 is rotated. The nozzle N and the distance sensor 46 are moved horizontally through the support arm 63 and the rotary head 64 as the slide block 62 moves horizontally. Since the nozzle N and the distance sensor 46 are not moved in the horizontal direction with respect to the rotary head 64, the spaced distance therebetween is maintained constantly in the horizontal direction.

The driving unit 30 moves the slide block 62, and rotary head 64, and the arm 65, and hence the nozzle N and the distance sensor 46, using, for example, an electric motor as a power source. In a plan view, the nozzle N and the distance sensor 46 are moved along a radial direction of the wafer W on a straight line orthogonal to the rotary axis of the wafer W.

Figure 16:
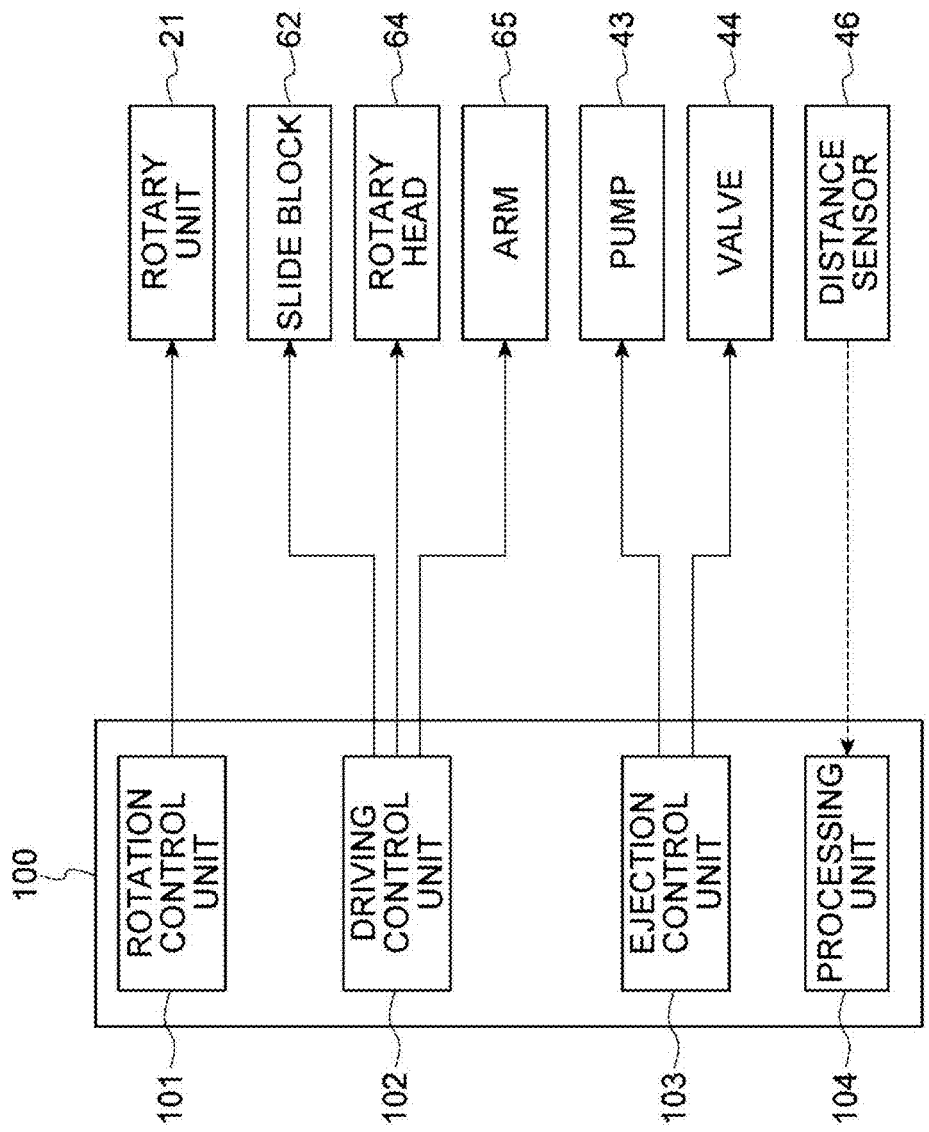
FIG. 16 is a block diagram illustrating a functional configuration of a control unit related to the fourth exemplary embodiment.

As illustrated in FIG. 16, the control unit 100 is different from that of the first exemplary embodiment in that the driving control unit 102 controls the slide block 62, the rotary head 64, and the arm 65, and the processing unit 104 performs a processing based on the input from the distance sensor 46. The driving control unit 102 controls the slide block 62 to move in the horizontal direction along the guide rail 61. The driving control unit 102 controls the rotary head 64 to be rotated around a vertical axis Ax with respect to the support arm 63. The driving control unit 102 controls the arm 65 to raise or lower the nozzle N in the vertical direction. Thus, the ejection port Na of the nozzle N moves toward or away from the surface Wa of the wafer W so that the gap G is changed.

The processing unit 104 receives height positions of the surface Wa of the wafer W measured by the distance sensor 46 and positional coordinates of the distance sensor 46 in the horizontal plane, in which the height position of each of the positional coordinates is measured, as height position data and positional coordinate data, respectively. The processing unit 104 associates and acquires the height position data and the positional coordinate data as data (in-plane shape data) in which the height positions of the surface Wa of the wafer W are mapped. The processing unit 104 controls the rotation control unit 101 or the driving control unit 102 based on the in-plane shape data.

With the functional configuration described above, the control unit 100 related to the fourth exemplary embodiment executes processings of: coating the coating liquid L in a spiral form on the surface Wa of the wafer W by causing the liquid supply unit 40 to eject the coating liquid L from the nozzle N while causing the driving unit 30 to move the nozzle N in a predetermined direction along the surface Wa of the wafer W between the rotary axis and the peripheral edge of the wafer W while the rotary holding unit 20 rotates the wafer W; making the linear velocity at an ejection position P substantially constant by causing the rotary holding unit 20 to rotate the wafer W in such a manner that, as the ejection position of the coating liquid L from the nozzle N is positioned nearer to the peripheral edge of the wafer W in the surface Wa of the wafer W, the number of rotations of the wafer W is reduced; and making the ejection flow rate of the coating liquid L ejected from the nozzle N substantially constant by causing the driving unit 30 to move the nozzle N upward or downward so that the height position of the ejection port Na of the nozzle N with respect to the surface Wa of the wafer W is changed based on the previously acquired in-plane shape of the surface Wa of the wafer W.

Next, the outline of the operations of the coating unit U1 will be described with reference to FIG. 15. First, a wafer W is conveyed to the inside of the coating unit U1 by a predetermined conveyance arm. When the wafer W is held on the holding unit 23 of the coating unit U1, the rotation control unit 101 and the driving control unit 102 of the control unit 100 are operated so that a processing of rotating the wafer W and a processing of moving the distance sensor 46 and the nozzle N are performed. Specifically, in-plane shape data for a predetermined region in the central portion of the wafer W is acquired using the distance sensor 46, and the coating liquid L from the nozzle N is coated on the region based on the previously acquired in-plane shape data for the predetermined region. In the outside of the predetermined region (peripheral edge side), as indicated by two-dot chain lines in FIG. 15, the slide block 62 moves the rotary head 64 toward the peripheral edge of the wafer W while rotating the rotary head 64 such that a scanning track of the nozzle N for the surface Wa of the wafer W and a scanning track of the distance sensor 46 for the surface Wa of the wafer W are approximately coincide with each other. As a result, (1) obtaining the in-plane shape data for the surface Wa of the wafer W, (2) controlling the height position of the ejection port Na of the nozzle N based on the acquired in-plane shape data such that the gap G between the surface Wa of the wafer W and the ejection port Na of the nozzle N becomes substantially constant, and (3) coating the coating liquid L on the surface Wa of the wafer W are performed substantially simultaneously. The control for making the gap G substantially constant is the same as that in the second exemplary embodiment. In addition, the rotation direction of the wafer W or the inclination of the rotary head 64 with respect to the support arm 63 is set such that the distance sensor 46 precedes the nozzle N.

In the fourth exemplary embodiment as described above, the gap G between the surface Wa of the wafer W and the ejection port Na of the nozzle N is made to be substantially constant in size by changing the height position of the ejection port Na of the nozzle N with respect to the surface Wa of the wafer W based on the previously acquired in-plane shape of the surface Wa of the wafer W while making the linear velocity at the ejection position P substantially constant. Thus, the quantity of the ejected coating liquid L becomes substantially equal at any ejection position P. In addition, in the fourth exemplary embodiment, the coating liquid L is coated in a spiral form on the surface Wa of the wafer W. Thus, the coating liquid L ejected from the nozzle N hardly overlaps on the surface Wa of the wafer W. From the foregoing, the film thickness of the coating film R formed as the coating liquid L is coated on the surface Wa of the wafer W becomes substantially uniform over the entire surface Wa of the wafer W.

In the fourth exemplary embodiment, the distance sensor 46 and the nozzle N are moved while maintaining the spaced distance of the distance sensor 46 and the nozzle N constantly in the coating processing such that the nozzle N passes the scanning track of the distance sensor 46 for the surface Wa of the wafer W. For that reason, when the nozzle N passes the position which the distance sensor 46 has passed on the surface Wa of the wafer W, the linear velocities of the nozzle N and the distance sensor 46 at the passing point thereof become substantially equal to each other. Accordingly, since the in-plane data acquired by the distance sensor 46 may be used as it is without correction, the calculation (data processing) at the time of controlling the height position of the nozzle N may be simplified and the gap G may be adjusted with a better precision.

Other Exemplary Embodiments

Figure 17:
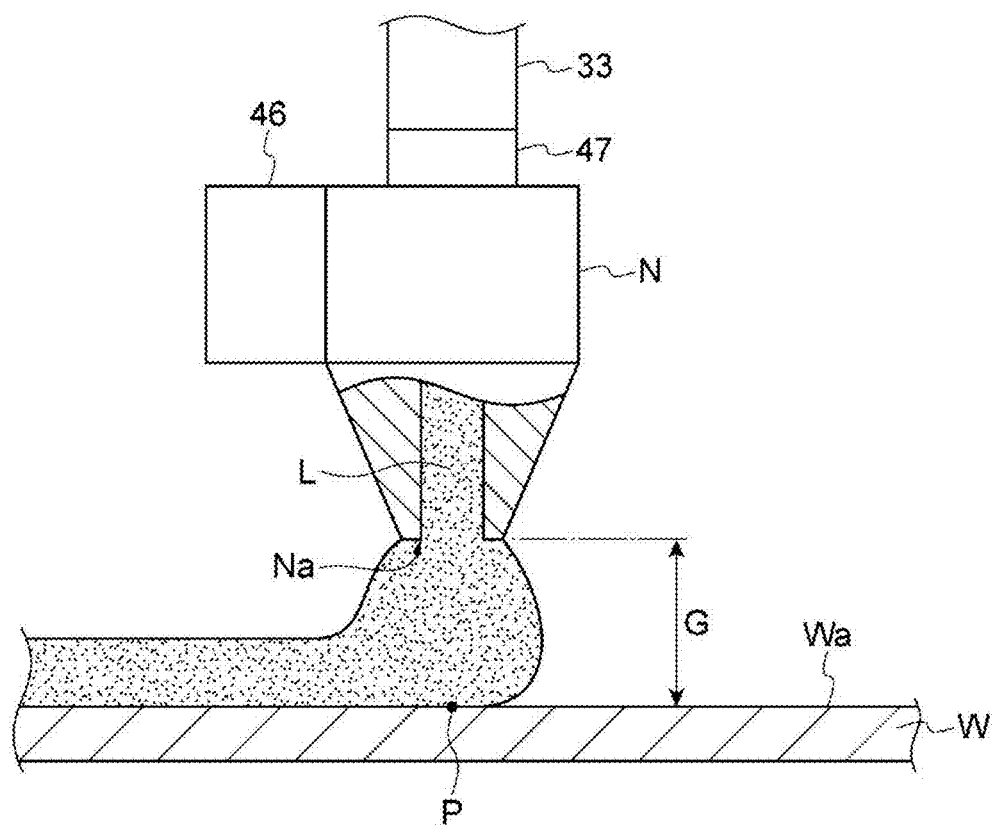
FIG. 17 is a schematic view illustrating the vicinity of a nozzle related to another example.

In the forgoing, although exemplary embodiments of the present disclosure have been described in detail, various modifications may be applied to the exemplary embodiments within the scope of the present disclosure. For example, in the first exemplary embodiment, the liquid supply unit 40 may include a load cell (reaction force measuring unit) 47 instead of the flow rate sensor 45. As illustrated in FIG. 17, the load cell 47 is disposed between the nozzle N and the arm 33. The load cell 47 measures the magnitude of the reaction force received by the nozzle N from the surface Wa of the wafer W through the coating liquid L when the nozzle N ejects the coating liquid L to the surface Wa of the wafer W. That is, in this exemplary embodiment, the physical quantity at the nozzle N that is ejecting the coating liquid L is the magnitude of the reaction force received by the nozzle N from the surface Wa of the wafer W through the coating liquid L.

The speed of the coating liquid L flowing out from the gap between the ejection port Na of the nozzle N and the surface Wa of the wafer W is proportional to the root of the pressure received by the surface Wa of the wafer W at the ejection position P from the coating liquid L ejected from the nozzle N. Since the magnitude of the reaction force received by the nozzle N from the surface Wa of the wafer W through the coating liquid L varies depending on the magnitude of the pressure received by the surface Wa of the wafer W from the coating liquid L ejected from the nozzle N at the ejection position P, the ejection flow rate of the coating liquid L from the nozzle N is indirectly controlled by controlling the magnitude of the reaction force measured by the load cell 47 to be a predetermined target value. As a result, the gap G may be controlled to be constant by controlling the magnitude of the reaction force measured by the load cell 47 to be the predetermined target value.

From the foregoing, when the reaction force measured by the load cell 47 becomes larger than the target value, the ejection flow rate is also increased and at the same time, the gap G is increased to be larger than a desired value. Thus, the processing unit 104 outputs an instruction to lower the arm 33 to the driving control unit 102. As a result, the nozzle N goes near to the surface Wa of the wafer W so that the gap G is decreased. Meanwhile, when the reaction force measured by the load cell 47 becomes smaller than the target value, the ejection flow rate is also decreased and at the same time, the gap G becomes smaller than the desired value. Thus, the processing unit 104 outputs an instruction to raise the arm 33 to the driving control unit 102. Thus, the nozzle N moves away from the surface Wa of the wafer W so that the gap G is increased.

Even in this case, the gap G between the ejection port Na of the nozzle N and the surface Wa of the wafer W can be changed in a short time and surely as in the case where the flow rate sensor 45 is used by performing a feedback control such that the reaction force measured by the load cell 47 approaches a predetermined magnitude. In particular, it may be considered that the nozzle N may vibrate up and down when the nozzle N is driven by the driving unit 30, thereby causing variation in film thickness. However, according to the feedback control using the load cell 47, the gap G may be controlled following such vibration.

Figure 18:
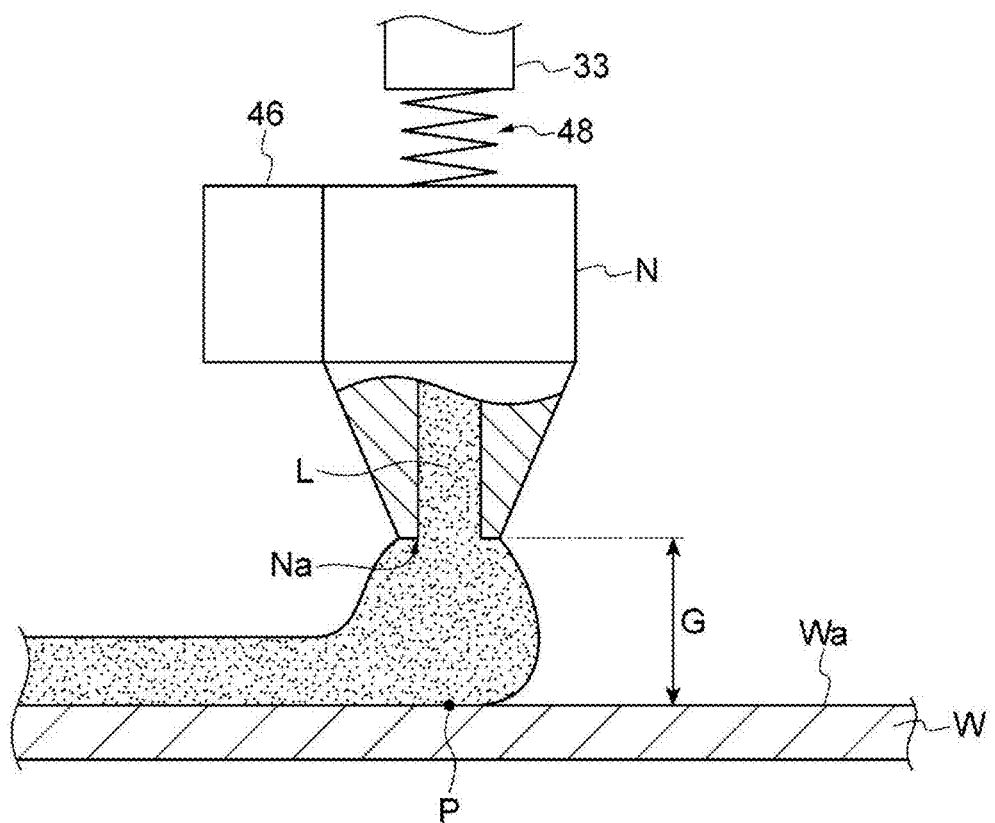
FIG. 18 is a schematic view illustrating the vicinity of a nozzle related to still another embodiment.

In the first exemplary embodiment, the liquid supply unit 40 may not be provided with the flow rate sensor 45 and, as illustrated in FIG. 18, an elastic body 48 may be disposed between the nozzle N and the arm 33. An example of the elastic body 48 may be a spring. The elastic body 48 changes the gap G between the ejection port Na of the nozzle N and the surface Wa of the wafer W depending on the reaction force received by the nozzle N from the surface Wa of the wafer W through the coating liquid L when the nozzle N ejects the coating liquid L to the surface Wa of the wafer W. That is, in this exemplary embodiment, the physical quantity at the nozzle N that is ejecting the coating liquid L is the magnitude of the reaction force received by the nozzle N from the surface Wa of the wafer W through the coating liquid L.

Specifically, when the reaction force received by the nozzle N is increased, a large force also acts on the elastic body 48 so that the elastic body 48 may tend to be contracted. However, by the elastic force (restoring force) of the elastic body 48, the nozzle N is pushed out toward the surface Wa of the wafer W. Thus, since the nozzle N approaches the surface Wa of the wafer W, the gap G is decreased. Meanwhile, when the reaction force received by the nozzle N is decreased, the force acting on the elastic body 48 is decreased so that the elastic body 48 tends to be expanded. However, by the restoring force of the elastic body 48, the nozzle N approaches the arm 33. Thus, since the nozzle N moves away from the surface Wa of the wafer W, the gap G is increased.

Even in this case, since a restoring force according to the reaction force received by the nozzle N is generated in the elastic body 48, the restoring force acts on the nozzle N so that the gap G between the ejection port Na of the nozzle N and the surface Wa of the wafer W may be changed in a short time and surely as in the case where the flow rate sensor 45 is used. In particular, it may be considered that the nozzle N may vibrate up and down when the nozzle N is driven by the driving unit 30, thereby causing variation in film thickness. However, according to the exemplary embodiment using the elastic body 48, the gap G may be controlled following such vibration.

In a case where the nozzle N is moved in a direction toward the center of the wafer W from the peripheral edge of the wafer W while the coating liquid L is coated in a spiral form on the surface Wa of the wafer W, the film thickness in the central portion of the wafer W may become different from that in the other region according to the precision of stopping the ejection of the coating liquid L from the nozzle N. For that reason, in each of the exemplary embodiments described above, after the nozzle N has been moved in the direction from the peripheral edge of the wafer W toward the center of the wafer W and has arrived at the center of the wafer W, the nozzle N may be moved toward the peripheral edge of the wafer W. In this case, since the coating liquid L is left in the state ejected from the nozzle N in the central portion of the wafer W, the film thickness of the coating film R formed on the surface Wa of the wafer W may be more uniformized. At this time, the coating liquid L will be coated again on the surface Wa of the wafer W.

In each of the exemplary embodiments, the control unit 100 performs a processing for making a linear velocity at an ejection position P substantially constant. However, the processing for making the linear velocity substantially constant may not be necessarily performed. When the linear velocity is made to be substantially constant, the film thickness of the coating film R may be more uniformized. However, even if the linear velocity is not made to be substantially constant, the film thickness of the coating film R may be uniformized to some extent.

In the second and third exemplary embodiments, the moving velocity of the distance sensor 46 at the time of measuring the in-plane shape and the moving velocity of the nozzle N at the time of coating processing may be set to be substantially equal to each other. In the second and third exemplary embodiments, the rotating speeds of the wafer W at the time of measuring the in-plane shape and the rotating speeds of the wafer W at the time of coating processing may be set to be equal to each other. That is, the scanning track of the distance sensor 46 on the surface Wa of the wafer W and the scanning track of the nozzle N on the surface Wa of the wafer W may be approximately coincide with each other. In this case, since it is not necessary to correct the in-plane shape data in consideration of variations of the moving speed of the distance sensor 46, the moving speed of the nozzle N, and the rotating speed of the wafer W, the calculation (data processing) at the time of controlling the height position of the nozzle N is simplified. In addition, while the measurement of the in-plane shape and the coating processing are performed, the spaced distance between the nozzle N and the distance sensor 46 may be maintained constantly or changed.

In the third exemplary embodiment, the coating liquid L is coated on the surface Wa of the wafer W after the in-plane shape data has been acquired for the entire surface Wa of the wafer W. Instead of this, however, the coating liquid L may be coated on the surface Wa of the wafer W while acquiring the in-plane shape data for the surface Wa of the wafer W. That is, the coating liquid L may be coated for a region where the in-plane shape data is acquired in the surface Wa of the wafer W. In this case, since a feed forward control is performed before the gap G is changed due to a change of the in-plane shape of the surface Wa of the wafer W, the gap G may be maintained in a substantially constant size. For that reason, since it is not necessary to measure the entire in-plane shape of the surface Wa of the wafer W before the coating processing, the entire processing time may be shortened.

Figure 19C:
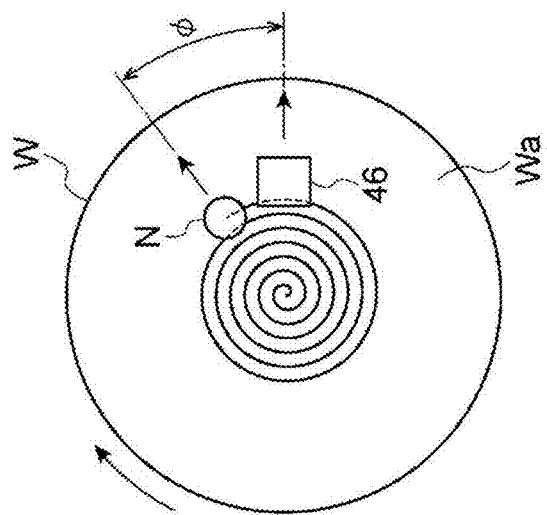
FIGS. 19A to 19C are views for describing a scanning state of a distance sensor and a nozzle in the coating unit related to the third exemplary embodiment.
Figure 19B:
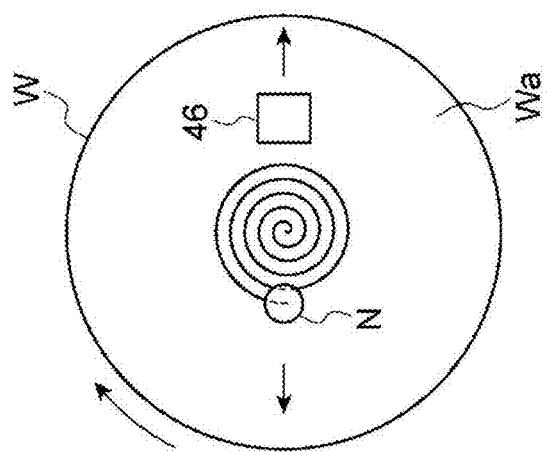
Figure 19A:
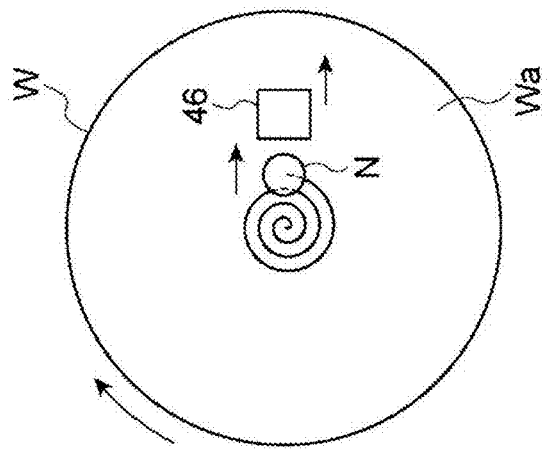

Descriptions will be made on a specific method of coating a coating liquid L on a surface Wa of the wafer W while acquiring in-plane shape data on the surface Wa of the wafer W with reference to FIGS. 19A to 19C. As illustrated in FIG. 19A, the distance sensor 46 and the nozzle N may be moved in the same direction. As illustrated in FIG. 19B, the nozzle N and the distance sensor 46 may be moved in the opposite directions. As illustrated in FIG. 19C, the nozzle N and the distance sensor 46 may be moved such that the moving direction of the nozzle N and the moving direction of the distance sensor 46 form a predetermined angle cp. Even in any case of FIGS. 19A to 19C, the nozzle N and the distance sensor 46 are moved from the center side of the wafer W toward the peripheral edge side, and the distance sensor 46 is positioned closer to the peripheral edge as compared to the nozzle N. In addition, FIG. 19A corresponds to a case in which the angle φ in FIG. 19C is set to 0°. FIG. 19B corresponds to a case in which the angle φ in FIG. 19C is set to 180°. In the case where the nozzle N and the distance sensor 46 are moved from the peripheral edge side of the wafer W toward the center side of the wafer W, the distance sensor 46 may be positioned to be closer to the center side as compared to the nozzle N.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A liquid coating method comprising:
    moving an ejection nozzle and a distance sensor along a radial direction of a substrate on a straight line orthogonal to a rotational axis of the substrate in a predetermined circular area of a surface of the substrate that has a predetermined radius from the rotational axis of the substrate in order to measure a height of an ejection port of the ejection nozzle with respect to the surface of the substrate by the distance sensor while rotating the substrate around the rotational axis such that height data of the predetermined circular area of the surface of the substrate is obtained;
    further moving the ejection nozzle and the distance sensor along the radial direction of the substrate on the straight line orthogonal to the rotational axis of the substrate in an outside of the predetermined circular area of the surface of the substrate in order to measure a height of the ejection port of the ejection nozzle with respect to the surface of the substrate by the distance sensor while rotating the substrate around the rotational axis such that a scanning track of the ejection nozzle with respect to the surface of the substrate and a scanning track of the distance sensor with respect to the surface of the substrate approximately coincide with each other and the distance sensor precedes the ejection nozzle on the coincided scanning tracks of the ejection nozzle and the distance sensor, thereby obtaining height data of the outside of the predetermined circular area of the surface of the substrate,
    obtaining positional coordinate data of the distance sensor in a horizontal plane, which corresponds to a position on the surface of the substrate where the height of the ejection port of the ejection nozzle with respect to the surface of the substrate in each of the predetermined circular area and the outside of the predetermined circular area is measured;
    mapping the height data of each of the predetermined circular area and the outside of the predetermined circular area of the surface of the substrate to the positional coordinate data of the distance sensor, thereby obtaining in-plane shape data of the predetermined circular area and the outside of the predetermined circular area of the surface of the substrate; and
    ejecting a coating liquid to the predetermined circular area and the outside of the predetermined circular area of the surface of the substrate from the ejection nozzle positioned above the surface of the substrate while rotating the substrate around the rotational axis extending along a direction orthogonal to the surface of the substrate such that the coating liquid is coated on the surface of the substrate,
    wherein the ejecting the coating liquid includes:
    ejecting the coating liquid from the ejection nozzle to the surface of the substrate while moving the ejection nozzle in a predetermined direction along the surface of the substrate between the rotational axis and a peripheral edge of the substrate during the rotation of the substrate such that the coating liquid is coated on the surface of the substrate in a spiral form;
    reducing a number of rotations of the substrate as an ejection position of the coating liquid from the ejection nozzle is positioned closer to the peripheral edge of the substrate within the surface of the substrate such that a linear velocity at the ejection position is substantially constant; and
    changing the height of the ejection port of the ejection nozzle with respect to the surface of the substrate based on the obtained in-plane shape data of the surface of the substrate such that an ejection flow rate of the coating liquid ejected from the ejection nozzle is maintained substantially constant,
    the obtaining the in-plane shape data, the changing the height of the ejection port of the ejection nozzle and the ejecting the coating liquid are performed substantially at the same time.

2. The liquid coating method of claim 1, wherein a moving speed of the distance sensor and a rotating speed of the substrate in the moving the ejection nozzle and the distance sensor are set to be substantially equal to a moving speed of the ejection nozzle and a rotating speed of the substrate in the ejecting the coating liquid, respectively.

3. The liquid coating method of claim 1, wherein the ejecting the coating liquid is performed along with the moving the ejection nozzle and the distance sensor in the predetermined circular area and the further moving the ejection nozzle and the distance sensor in the outside of the predetermined circular area of the surface of the substrate.

4. The liquid coating method of claim 3, wherein the further moving the ejection nozzle and the distance sensor in the outside of the predetermined circular area of the surface of the substrate comprising:
    moving the distance sensor and the ejection nozzle while maintaining a constant spaced distance between the distance sensor and the ejection nozzle.

* * * * *